US006426889B2

(12) United States Patent
Sekiguchi et al.

(10) Patent No.: US 6,426,889 B2
(45) Date of Patent: *Jul. 30, 2002

(54) SEMICONDUCTOR INTEGRATED CIRCUIT

(75) Inventors: Tomonori Sekiguchi, Kokubunji; Riichiro Takemura, Tokyo; Kazuhiko Kajigaya, Iruma; Katsutaka Kimura, Akishima; Tsugio Takahashi, Hamura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/923,542

(22) Filed: Aug. 8, 2001

Related U.S. Application Data

(63) Continuation of application No. 09/532,734, filed on Mar. 22, 2000, now Pat. No. 6,278,628.

(30) Foreign Application Priority Data

Mar. 29, 1999 (JP) .............................. 11/85386

(51) Int. Cl.⁷ ................................. G11C 5/06
(52) U.S. Cl. ..................... 365/63; 365/51; 365/230.03
(58) Field of Search ....................... 365/63, 51, 230.03, 365/230.06, 189.08, 206

(56) References Cited

U.S. PATENT DOCUMENTS

| 5,636,158 | A | | 6/1997 | Kato et al. .................. 365/63 |
| 6,188,596 | B1 | * | 2/2001 | Holst ......................... 365/63 |
| 6,278,628 | B1 | * | 8/2001 | Sekiguchi et al. .......... 365/63 |

FOREIGN PATENT DOCUMENTS

| JP | 62-11262 | 1/1987 |
| JP | 4-318392 | 11/1992 |

OTHER PUBLICATIONS

Very Large Scale Integrated Memories, Baifukan, Nov. 5, 1994, 1st Edition, K. Itoh, pp. 214–217.
IEEE Journal of Solid–State Circuits, vol. 25, No. 3, 1990, pp. 778–789.
IEEE Journal of Solid–State Circuit, vol. SC–15, No. 5, Oct. 1980, H. Masuda et al, pp. 846–854.

* cited by examiner

Primary Examiner—David Lam
(74) Attorney, Agent, or Firm—Mattingly, Stanger & Malur, P.C.

(57) ABSTRACT

In a large scale integrated DRAM in pursuit of micro fabrication, data line-word line coupling capacitances are unbalanced between paired data lines. A data line-word line imbalance generates large noise when the data lines are subjected to amplification, which is highly likely to invite deterioration of very small signals on the data lines and erroneous amplification of data. One or a few of a plurality of word lines connected to a plurality of memory cells connected to one data line are alternately connected to subword driver arrays arranged on the opposing sides of a memory array. Positive and negative word line noise components cancel each other in the subword drivers when the data lines are subjected to amplification, so that the word line noise can be reduced. Therefore, signals read out by sense amplifiers can be prevented from deterioration thereby to increase the reliability of memory operation.

19 Claims, 14 Drawing Sheets

SEMICONDUCTOR INTEGRATED CIRCUIT

This application is a continuation application of U.S. application Ser. No. 09/532,734, filed Mar. 22, 2000, now U.S. Pat. No. 6,278,628.

FIELD OF THE INVENTION

The present invention relates to reduction of memory array noise in a semiconductor apparatus involving a memory array or arrays.

BACKGROUND OF THE INVENTION

The items of literature referenced in this specification are listed below, and they will be referenced by reference number. [Reference 1]: ITOH, K., *Very Large Scale Integrated Memories,* Baifukan, Nov. 5, 1994 (1st edition), pp. 214–217, and [Reference 2]: K. Itoh, *IEEE Journal of Solid State Circuit,* Vol. 25, No. 3, (1990); pp. 778–789 ([Reference 2] is the original work referenced in [Reference 1]).

[Reference 1] discusses noise arising via word lines when a dynamic random access memory (DRAM) is subjected to amplification. It further discusses, as a case of noise arising via word lines, the phenomenon that a noise voltage on an unselected word line attributable to the coupling capacitance of data lines and the word line gives rise to noise on paired data lines. The impact of that noise is dependent on the structure of the paired data lines (whether an open data line structure or a folded data line structure) and the data line precharging system (whether a VD precharging system or a VD/2 precharging system). As a conclusion, it is stated that the use of a folded data line structure and a VD/2 precharging system helps reduce the noise.

The inventors pertaining to the present application for patent, before filing the application, studied in detail the occurrence of noise attributable to the structure of a 1 Gb DRAM array using micro fabrication technology of 0.16 to 0.13 μm and the coupling capacitance of data lines and word lines. FIG. 10 illustrates a planar layout of the DRAM array studied before this application and part of a corresponding circuit diagram. In the planar layout of (a), memory cells (MCs) are disposed at prescribed intersections of data lines (DLs) and word line (WLs). This data line structure is a so-called folded data line structure. Here are shown only the DLs for reading signals out of memory cells, the WLs serving as gates for selecting transistors, regions of diffused layer (ACTs), data line contacts (DLCTs) for connecting ACTs and DLs and storage node contacts (SNCTs) for connecting ACTs and storage nodes of capacitors, but the storage nodes connected to the SNCTs are not shown. Above and underneath the memory array are arranged an upper subword driver array (SWDA-U) and a lower subword driver array (SWDA-D), and two word lines WLs are alternately connected to the upper and lower subword driver arrays. Subword driver will be abbreviated to SWD below as required. To the left and right of the memory array are disposed a left sense amplifier array (SAA-L) and a right sense amplifier array (SAA-R), respectively, and two data lines DLs are alternately connected to the left and right sense amplifier arrays. Sense amplifier will be abbreviated to SA below as required.

These alternate arrangements of SWDs and SAs are intended to ease the tightness of their layout pitches. To look at the boundary between the SWDA-U and the memory array, for instance, there is seen a reiterated pattern of two WLs each passing the boundary and entering the SWD (WL0, WL1, WL4 and WL5) and ones ending at the boundary (WL2, WL3, WL6 and WL7). Connection of WLs to the SWD in this manner makes possible easing of the layout pitch per SWD in the direction of data lines to an equivalent of two WLs. For the layout of the SAs as well, the alternate arrangement serves to ease the pitch in the direction of word lines to two pairs of DLs (four DLs). Since memory cells are extremely small in a DRAM, the pitches of WLs and DLs are very fine. This means increased difficulty in laying out SWDs and SAs at prescribed pitches, and accordingly the alternate arrangement can make an important contribution.

Now to look at the relationships of connection between the WLs and the SWD arrays, more specifically to two mutually adjoining memory cells MC0 and MC1 which are connected to the DL0T, both the WL0 and the WL1 connected to these cells are connected to the SWDA-U. On the other hand, to look at two other mutually adjoining memory cells MC2 and MC3 connected to the DL0B, they also share the same DLCT, and both the WL2 and the WL3 connected to these cells are connected to the SWDA-D. Therefore, in the layout of the memory array of FIG. 10, the WLs connected to the two memory cells sharing the DLCT are connected to the same SWD array. In an overall view of the memory array, as the pattern shown in FIG. 10(a) is reiterated vertically and horizontally, all the WLs connected to the MCs connected to the DL0T (WL0, WL1, WL4 and WL5 in the diagram) are connected to the SWDA-U, and all the WLs connected to the MCs connected to the DL0B (WL2, WL3, WL6 and WL7 in the diagram) are connected to the SWDA-D. Accordingly all the word lines connected to memory cells connected to any one data line are connected to the same subword driver array.

These relationships are represented in a circuit diagram which is presented as FIG. 10(b). In a folded data line structure, memory cells are connected to half of the intersections between data lines and word lines. For instance, while the memory cell MC0 is connected between the DL0T and the WL0, no MC is connected between the DL0B and the WL0. An MC consists of a selecting transistor TG and a cell capacitor CS. One of the electrodes of the CS is a plate PL, which is connected in common with other memory cells in the array. The other electrode of the CS is connected to either one of the source or the drain of the TG, and the other of the drain or the source of the TG is connected to the DL. The DL0T and the DL0B are paired and connected to the SA0 in the SAA-L, and the DL1T and the DL1B are connected to the SA1 in the SAA-R. These SAs amplify a very small voltage difference generated between paired DLs by a signal from the memory cell to a higher level for one DL and to a lower level for the other DL.

Only the parts of MC0, MC1, MC2 and MC3 FIG. 10 are enlarged, with their enlarged layout is shown in FIG. 11(a) and their circuit diagram in FIG. 11(b). Parasitic capacitors emerging between the WLs and DLs of these MCs are also shown. Between the WL0 or WL1 and the DL0T arises a parasitic capacitance C00 or C01, respectively. Between the WL0 or WL1 and the DL0B arises a parasitic capacitance C00B or C0B, respectively. Between the WL2 or WL3 and the DL0B arises a parasitic capacitance C02 or C03, respectively. Between the WL2 or WL3 and the DL0T arises a parasitic capacitance C02B or C03B, respectively.

Cross sections A–A', B–B' and C–C' of the parts pointed by arrows in the layout of FIG. 11(a) are respectively illustrated in FIG. 12(a), (b) and (c). The cross sections in FIG. 12 refer to areas near the two word lines WL0 and WL1 in the direction represented by arrows in FIG. 11(a). The ACT region on the substrate is the active region of the MOS transistor, while other parts on the substrate are device isolation regions. Over them are wired WLs and DLs, and the DLs are connected to ACTs by oval DLCTs. SNs are storage nodes of cell capacitors CSs, and connected to the ACTs by SNCTs. The upper electrodes PLs of the CSs are commonly connected by cells in the array, and over them are arranged two-layered metallic wires M2 and M3.

To compare C00 and C00B here, as shown in the cross section A–A' of FIG. 12(a), the DLCT0 connected to the DL0T passes between the WL0 and the WL1 very close to them. The distance between the DLCT0 and the WL0, where the memory cell is made by micro fabrication, is about 30 nm. Therefore, the C00, which is a capacitance between the DL0T and the WL0, is substantially determined by the part between the DL0T and the WL0.

On the other hand, as shown in the cross section B–B' of FIG. 12(b), the DL0B merely passes above the WL0, and the C00B, which is the capacitance between the DL0B and the WL0, is determined by the interlayer distance between the DL and the WL, and is about 250 nm in the 0.13 $\mu$m generation. Therefore, the C00B is far smaller than the C00; a detailed capacitance simulation has revealed that the C00B is about 1% against a C00 of 100%. Thus, as illustrated in FIG. 11(b), in a folded data line structure, although the coupling capacitance of the WL0 with respect to the DL0T and the DL0B may appear balanced between the C00 and the C00B, the C00 is predominantly great in a large scale integrated DRAM using small memory cells, resulting in an imbalance. Similarly, the C01, C02 and C03 are far greater than the C01B, C02B and C03B, respectively. In other words, the DL-WL coupling capacitance is great in the presence of an MC between the DL and the WL, but negligibly small in its absence.

This imbalance in DL-WL coupling capacitance is a new problem which has become actualized by the decrease in the thickness of the insulating film parallel to the substrate relative to the thickness of the interlayer insulating film in the direction normal to the substrate, which in turn has resulted from the large scale integration of the DRAM. In a memory array in which the DL-WL coupling capacitance is unbalanced, WL noise posses a problem as will be described below.

FIG. 13 illustrates the memory array of FIG. 10 and a data pattern in a case wherein the word line noise reaches its peak. The WL0 through the WL7 are connected to the SWD0 through the SWD7, respectively; the SWD0, SWD1, SWD4 and SWD5 are arranged in the SWDA-U; and the SWD2, SWD3, SWD6 and SWD7 are arranged in the SWDA-D. The DL0T and DL0B are connected to the SA0 in the SAA-L, and the DL1T and DL1B are connected to the SA1 in the SAA-R. The circuit diagram of the SAs is presented as FIG. 14(a), and the operating wave forms of the array are shown in FIG. 14(b).

Now is considered with reference to FIG. 13 a case in which the WL0 is selected. Other WLs than the WL0 in the array are connected to either a VSSU or a VSSD by an N-channel MOS transistor in the SWD. As illustrated in FIG. 14(b), every SWD's output is 0 V during standby. In each MC, the selecting transistor is turned off, and a voltage of VDL (e.g. 1.8 V) or VSS (e.g. 0 V) is written into the capacitor according to information. In each SA, the SHRU and SHRD are at VPP (e.g. 3.5 V), the CS and CSN are at VBLR (e.g. 0.9 V), the BLEQ is at VPP, and the YS is 0 V, while the DL is precharged to a potential of VBLR.

When a bank activate command and an address entered into the DRAM, if the memory array illustrated here is selected, the SHRL and BLEQ will be reduced to 0 V, and the precharging is interrupted, followed by the activation of the WL0 to 3.5 V in the SWD0. Then the selecting transistor of the MC leading to the WL0 is turned on, and signals emerge from the cell capacitor to the DL0, DL1 and so forth. It is supposed now that low level (L) signals to all the 1024 pairs or 2048 units of T side DLs from DL0T through DL1023T except the DLnT, and a high level (H) signal appears only to the DLnT. Then, since no signals emerges to the other DLs, from DL0B through DL1023B, they remain at 0.9 V. This pattern, or a pattern inverted with respect to H and L, is the worst condition in which the WL noise is at its greatest. Then, as the SA is activated by driving the CSN to 0 V and the CSP to 1.8 V, all the DLs from DL0T through DL1023T except DLnT are amplified to 0 V, and all the DLs from DL0B to DL1023B except DLnB are amplified to 1.8 V.

How this takes place is illustrated in FIG. 13. The circled Ls above the DL0T and the DL1T indicated that the DL0T and the DL1T are amplified to 0 V, and the circled Hs above the DL0B and the DL1B indicate that the DL0B and the DL1B are amplified to 1.8 V. The noise then arising on the WL0 will be as follows. The WL0 receives negative noise from the data lines from DL0T through DL1023T other than the DLnT via a coupling capacitance. On the other hand, the WL0 receives positive noise from the data lines from DL0B through DL1023B other than the DLnB via a coupling capacitance. Whereas the noise arising on the WL0 will be the sum of these noise components, since the WL0 is connected to the MC which in turn is connected to the T side DLs from DL0T through DL1023T as stated above, the WL0-DL0B coupling capacitance, for instance, is only about 1% of the WL0-DL0T coupling capacitance. Thus, the coupling capacitance between the WL0 and data lines on the B side is negligibly smaller than the coupling capacitance of data lines between the WL0 and the T side. Therefore, the negative noise arises almost uncanceled on the WL0. This is indicated by the circled minus signs above the WL0. Similarly, negative noise arises on the WL1, WL4 and WL5. Conversely, as the WL2, WL3, WL6 and WL7 are connected to the MC which in turn is connected to the B side DLs from DL0B through DL1023B, the WL2-DL0T coupling capacitance, for instance, is smaller than, only about 1% of, the WL0-DL0B coupling capacitance. Thus, the coupling capacitance between the WL2 and data lines on the T side is negligibly smaller than the coupling capacitance of between the WL2 and data lines on the B side. Therefore, positive noise arises on these WLs, which is indicated by the circled plus signs above the WLs. In the waveform of FIG. 14(b) as well, WL noise on the WL0, WL1 and WL2 is represented.

The noise having arisen here on the WLs will flow as an electric charge to the VSS wires over the SWD through the channel MOS transistor in the SWD. As this VSS wiring in a DRAM extends for a few millimeters over the SWD from a bonding pad for voltage source in the middle of the chip to an end of the chip, it has a high impedance. Therefore, the noise having arisen on a word line emerges as it is in the VSS on the SWD.

While this WL noise is positive on one half of all the WLs of the array and negative on the other half, the alternate connection of WLs to two SWDs in the array of FIG. 13 results in the occurrence of negative noise on every WL connected to the SWDA-U and of positive noise on every WL connected to the SWDA-D. Therefore, the negative noise components having arisen on the VSSU, which is the VSS wiring on the SWDA-U, reinforce one another, and the positive noise components having arisen on the VSSD, which is the VSS wiring on the SWDA-D, also reinforce one another. Accordingly these noise aggregates are very great. A detailed circuit simulation has revealed that they are about 100 mV each. Furthermore, noise components having arisen on WLs take a long time to attenuate because they are not canceled until they reach the bonding pad for voltage source in the middle of the chip.

This WL noise occurring during DL amplification returns to the DLs via the WL-DL coupling capacitance, and invites erroneous actions. When an H level signal emerges only on the DLnT as shown in FIG. 13, negative noise components from the WL0, WL1, WL4, WL5 and so forth return to the DLnT. Also, positive noise components from the WL2, WL3, WL6, WL7 and so forth return from the DLnB. Thus, as viewed from the DLn pairs, noise in the reverse direction to the desired signals return to reduce the quantity of signals. If the electric charge stored in the cell capacitor of the memory cell at the intersection between the WL0 and the DLnT has been reduced by a leak or otherwise, there will be less of H level signals emerging at the DLnT when the WL0 is activated, so that this WL noise will invert the data at the time of amplification. How this occurs is illustrated in FIG. 14; the DLnT and DLnB are amplified in the direction reverse to the minute difference in potential having arisen on the DLnT and DLnB at the time of WL activation, inviting erroneous reading of data.

Thus, in the memory array of FIG. 10 studied before this application for patent, as the WL noise components on word lines work in a direction of reinforcing one another in the sense amplifier driver SWD in the worst case, there is the problem of increased WL noise. This deteriorates the signal read out by the sense amplifier, and accordingly destabilizes the operation of the memory.

Therefore, an object of the present invention is to provide a highly reliable memory array by reducing the noise arising on word lines when data lines are subjected to amplification in a large scale integrated DRAM in pursuit of micro fabrication.

SUMMARY OF THE INVENTION

A typical means of the invention is summarized below. Every other or every few of a plurality of word lines connected to a plurality of memory cells connected to one data line are disposed to be connected to subword driver arrays arranged on the mutually opposite sides of a memory array. This disposition has an effect that, in the worst pattern of word line noise in which all the other data line pairs than the aforementioned pair to be noted read out data reverse to those of the noted pair, half of the word lines connected to receive positive noise and the other half receive negative noise, so that noise components on these word lines cancel each other on a ground level source line in the subword driver array and are thereby reduced. Similarly, in the subword driver array arranged along the other side of the memory array, half of the word lines connected to receive positive noise and the other half receive negative noise, so that noise components on these word lines cancel each other on a ground level source line in the subword driver array and are thereby reduced.

DETAILED DESCRIPTION OF THE PREFERRED EMBODIMENTS

Figure 1A:
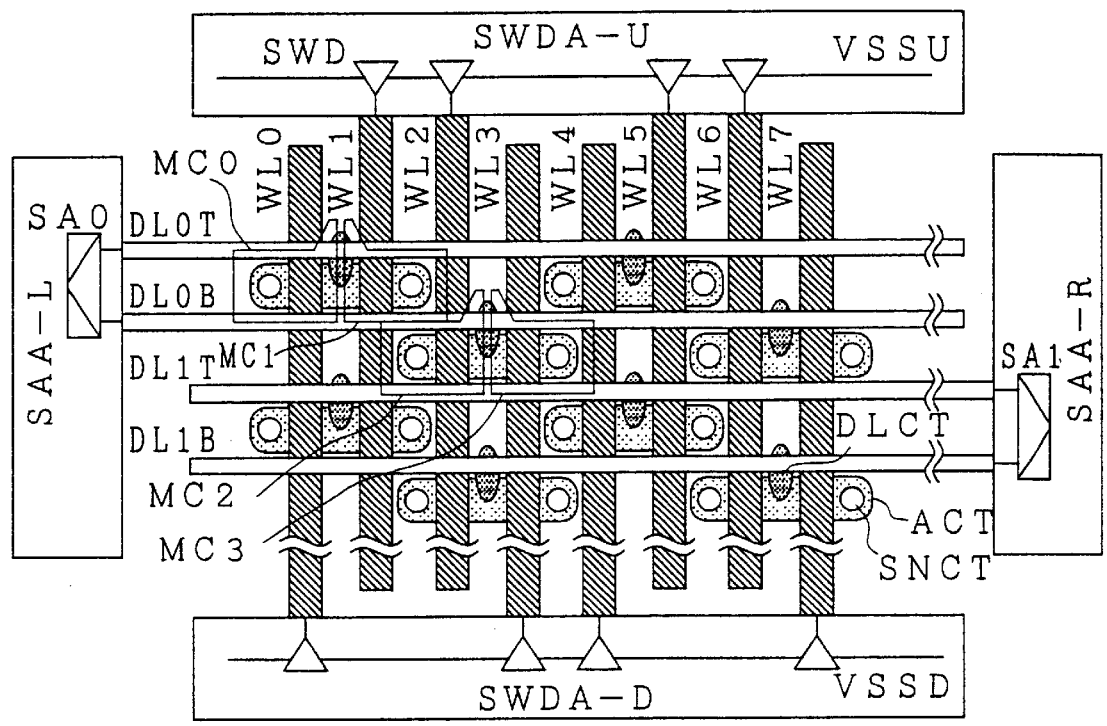
FIGS. 1A–1B respectively illustrate a layout and a circuit diagram of a first work line noise decreased memory array according to the present invention.

Preferred embodiments of the present invention will be described in detail below with reference to drawings. Although circuit devices constituting each block or the embodiments are not confined to specific types, they are formed over a single semiconductor substrate, such as one of single crystal silicon by a known circuit integrating technology, such as one for complementary MOS (CMOS) transistors or the like. Circuit symbols for metal oxide semiconductor field effect transistor (MOSFET) denote N-type MOSFETs (NMOSs) if without arrow, or P-type MOSFETs (PMOSs) if with an arrow, except in FIGS. 3, 8 and 9 wherein NMOSs are marked with an arrow in a direction reverse to that for PMOSs to ensure clear distinction between NMOSs and PMOSs. In the following description, MOSFETs may be referred to as MOSs for the sake of brevity. However, the present invention is not restricted to field effect transistors (FETs) containing an oxide disposed between a metallic gate and a semiconductor layer, but it can be applied to FETs in general including metal insulator semiconductor field effect transistors (MISFETs).

(Embodiment 1)

FIG. 1 shows a planar layout of a first word line noise decreased memory array according to the present invention and part of a corresponding circuit diagram. In the planar layout of (a), a memory cell (MC) is arranged at each prescribed intersection of a data line (DL) and a word line (WL). This layout shows only DLs for reading signals out of memory cells, WLs each constituting the gate of a selecting transistor, regions of diffused layer (ACTs), data line contacts (DLCT) each for connecting an ACT and a DL, and storage node contacts (SNCTs) each for connecting an ACT and the storage node of a capacitor, but the illustration of storage node of capacitors to be connected to SNCTs is dispensed with. Essentially, one array has about 2048 DLs and about 512 WLs, but only some of them are shown here. Above and underneath the memory array are arranged an upper subword driver array SWDA-U and a lower subword driver array SWDA-D, and two word lines WLs are alternately connected to the upper and lower subword driver arrays. To the left and right of the memory array are disposed a left sense amplifier array SAA-L and a right sense amplifier array SAA-R, respectively, and two data lines DLs are alternately connected to the left and right sense amplifier arrays.

These alternate arrangements of SWDs and SAs are intended to ease the tightness of their layout pitches. To look at the boundary between the SWDA-U and the memory array, for instance, there is seen a reiterated pattern of two WLs each passing the boundary and entering the SWD (WL1, WL2, WL5 and WL6) and ones ending at the boundary (WL0, WL3, WL4 and WL7). Connection of WLs to the SWD in this manner makes possible easing of the layout pitch per SWD in the direction of data lines to an equivalent of two WLs. Furthermore, while WL patterning requires a super resolution lithography such as phase shift lithography or off-axis illumination, connection of two mutually adjoining WLs to an SWD makes possible connection of two WLs whose optical phases are inverse to each other, and accordingly it is made easier to lay out the SWD.

For the layout of the SAs as well, the alternate arrangement serves to ease the pitch in the direction of word lines to two pairs of DLs (four DLs). Since memory cells are extremely small in a DRAM, the pitches of WLs and DLs are very fine. This means increased difficulty in laying out SWDs and SAs at prescribed pitches, and accordingly the alternate arrangement can make an important contribution.

Now to look at the relationships of connection between the WLs and the SWD arrays, the present invention is characterized by the relationship of connection between alternately arranged SWD arrays and WLs. To look at two mutually adjoining memory cells MC0 and MC1 which are connected to the DL0T, these cells sharing a single DLCT, out of the WLs connected to these cells, while the WL0 is connected to the SWDA-D, the WL1 is connected to the SWDA-U. On the other hand, to look at two other mutually adjoining memory cells MC2 and MC3 connected to the DL0B, these cells also sharing the same DLCT, out of the WLs connected to these cells, while the WL2 is connected to the SWDA-U, the WL3 is connected to the SWDA-D. Therefore, in the layout of the word line noise decreased memory array of Embodiment 1, the WLs connected to the two memory cells sharing the DLCT are connected to different SWD arrays.

In an overall view of the memory array, as the pattern shown in FIG. 1(a) is reiterated vertically and horizontally, half of the WLs connected to the MCs connected to the DL0T (WL1 and WL5 in the diagram) are connected to the SWDA-U, and the other half (WL0 and WL4 in the diagram) are connected to the SWDA-D. Further, half of the WLs connected to the MCs connected to the DL0B (WL2 and WL6 in the diagram) are connected to the SWDA-U, and the other half (WL3 and WL7 in the diagram) are connected to the SWDA-D. Accordingly, out of all the word lines connected to memory cells connected to any one data line, half are connected to one of the two subword driver arrays, and the other half are connected to the other subword driver array. Furthermore, SWDs in the SWDA-U are connected to VSSU, a common VSS line. Similarly, SWDs in the SWDA-D are connected to VSSD, another common VSS line. Wiring of the VSSs in this manner makes it possible to cancel WL noise on the VSSs.

Figure 1B:
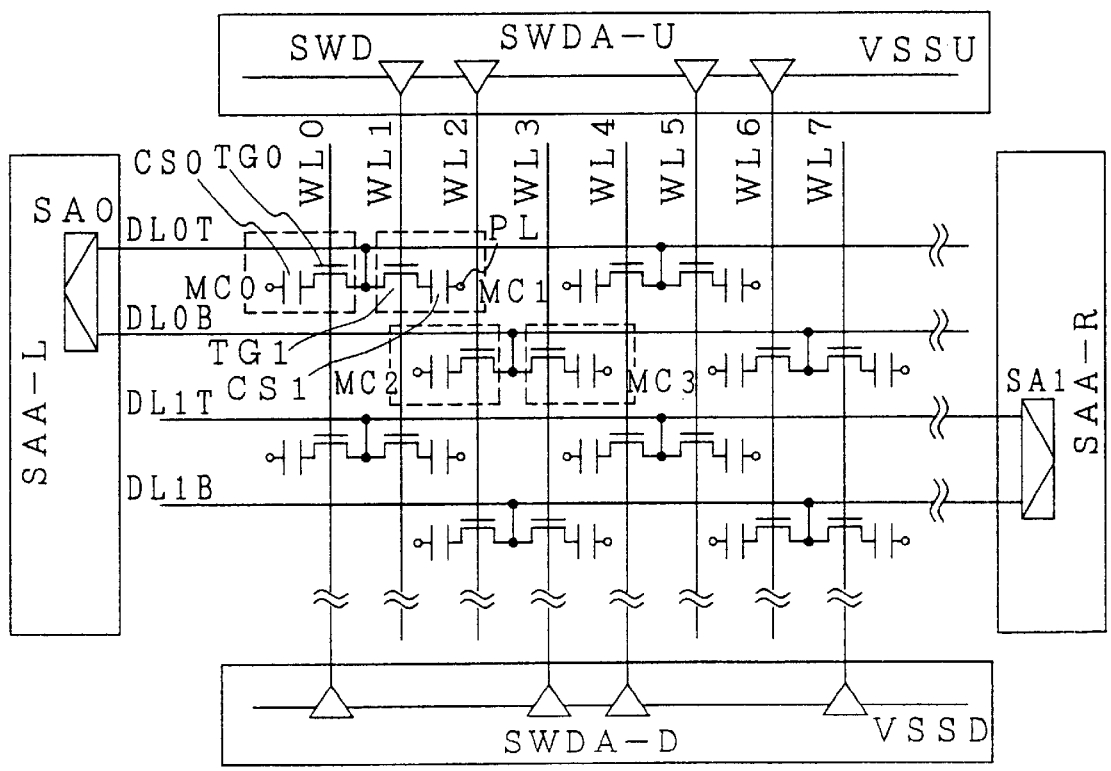

These relationships are represented in a circuit diagram which is presented as FIG. 1(b). In a folded data line structure, memory cells are connected to half of the intersections between data lines and word lines. For instance, while the memory cell MC0 is connected between the DL0T and the WL0, no MC is connected between the DL0B and the WL0. An MC consists of a selecting transistor TG and a cell capacitor CS. One of the electrodes of the CS is a plate PL, which is connected in common with other memory cells in the array. The other electrode of the CS is connected to either one of the source or the drain of the TG, and the other of the drain or the source of the TG is connected to the DL. The DL0T and the DL0B are paired and connected to the SA0 in the SAA-L, and the DL1T and the DL1B are connected to the SA1 in the SAA-R. These SAs amplify a very small voltage difference generated between paired DLs by a signal from the memory cell to a higher level for one DL and to a lower level for the other DL.

In this manner of connection, as will be explained in detail below, when the DL0T and DL0B are amplified by the SA0 to high and low levels, respectively, though negative noise arises on the WL0 and W01 and positive noise arises on the WL2 and WL3, the positive and negative noise components respectively arising on the WL1 and WL2 cancel each other on the VSSU, which is a voltage source line on the SWDA-U. Similarly, the positive and negative noise components respectively arising on the WL0 and WL3 cancel each other on the VSSD, which is a voltage source line on the SWDA-D. Since WL noise components from a data line pair cancel each other in the memory array according to the invention, the noise canceling effect will not be affected by any data pattern that may arise on any other data line pair in the array.

Figure 2:
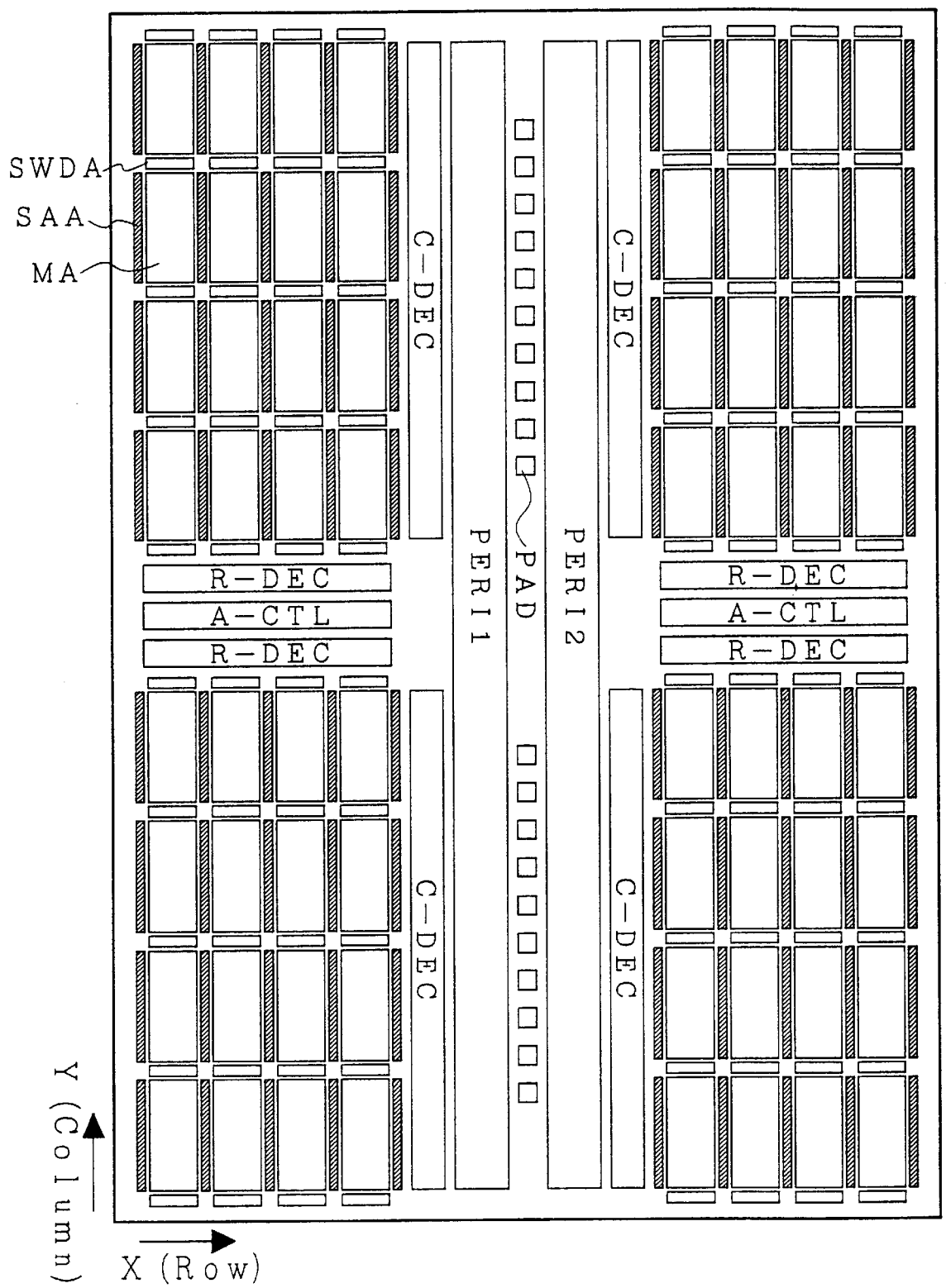
FIG. 2 illustrates a configuration of a DRAM chip.

The configuration of a DRAM using the word line noise decreased memory array according to the invention will be described below. FIG. 2 illustrates the configuration of the DRAM chip. In the middle of the chip along the longer sides are disposed bonding pads (PADs) and indirect peripheral circuits (PERI1 and PERI2). In this section are arranged input/output circuits for addresses and data, a power circuit, a refresh control circuit, a main amplifier and so forth. Along the shorter sides are disposed array control circuits (A-CTLs) for controlling the SWDs and SAs. These circuits broadly divide the chip into four blocks, which surround row decoders (R-DECs), each connected to a main word line, and column decoders (C-DECs), each connected to a column selecting line. Each block is divided by sense amplifier arrays (SAAs) in the direction of rows and by subword driver arrays (SWDAs) in the direction of columns. Each part surrounded by the SAAs and SWDs is the memory array (MA) show in FIG. 1.

Figure 3:
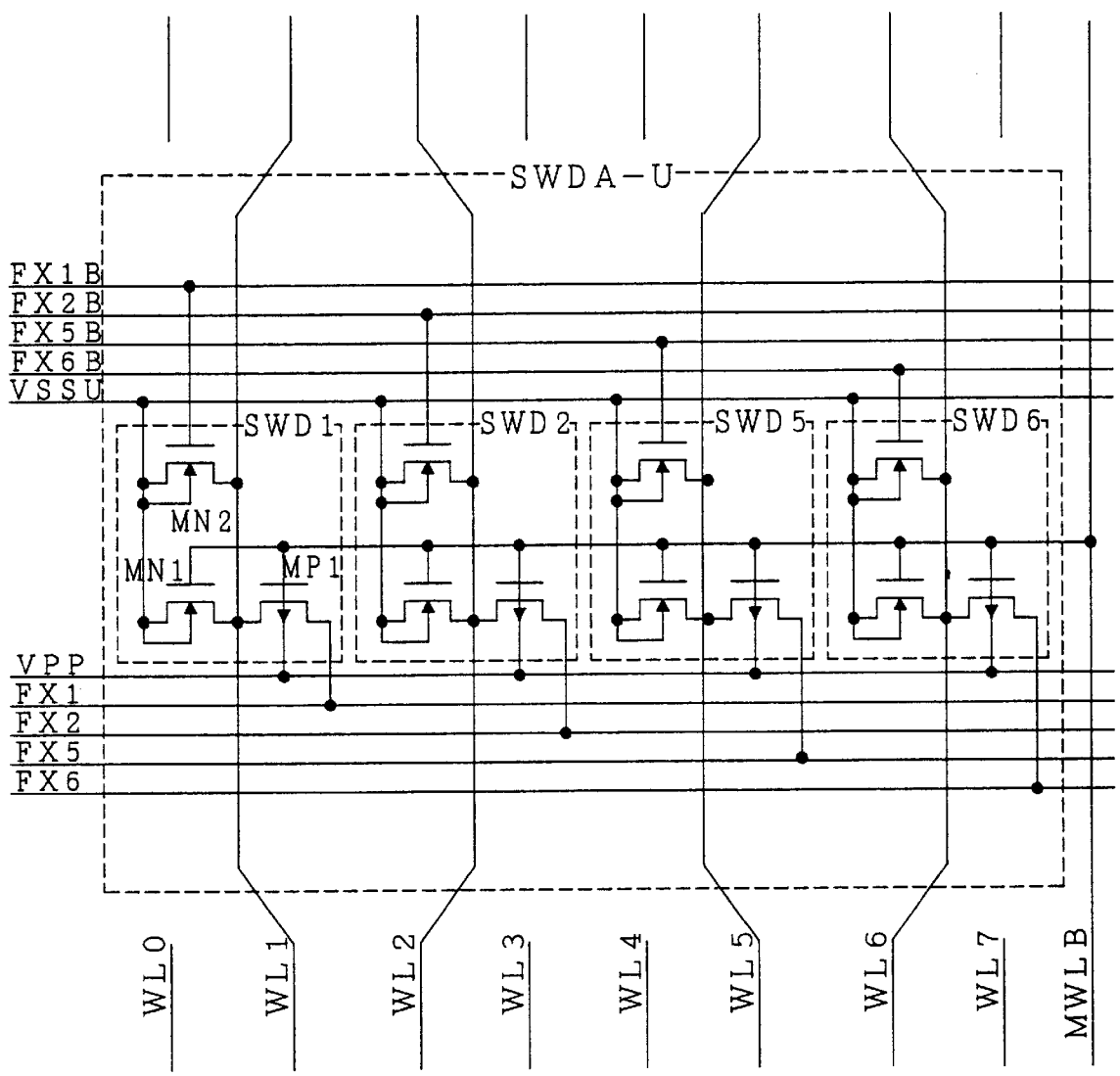
FIG. 3 is a circuit diagram of a first subword driver arrangement for use in the word line noise decreased memory array according to the invention.

FIG. 3 illustrates a first subword driver (SWD) arrangement for use in the word line noise decreased memory array according to the invention, shown in FIG. 1. In this SWD arrangement, every SWD in the same SWD array (SWDA) is connected to a common grounding line VSSU. Further, as the SWDs are alternately arranged relative to the memory array, on the boundary between the SWDA-U and the memory array it is found that some WLs (WL1, WL2, WL5 and WL6) pass the boundary and enter SWDs while others (WL0, WL3, WL4 and WL7) end at the boundary, the two different patterns alternating each other at every second WL. The WL noise decreased memory array according to the invention is characterized by the arrangement that half each of the WLs connected to the MCs connected to the DL0T of FIG. 1 (WL1 and WL5) and the WLs connected to the MCs connected to the DL0B (WL2 and WL6) is connected to an SWD in the SWDA-U.

To take up the SWD1 as an example, one SWD is composed of two N-channel MOS transistors MN1 and MN2 and one P-channel MOS transistor MP1. The sources of the MN1 and MN2 are connected to the VSSU while their drains are connected to the WL1. The gate of the MN1 is connected to the main word line (MWLB), and that of the MN2 is connected to the FX1B. The substrates (either the back gate or the well potential) of both the MN1 and MN2 may be connected either to the VSSU as illustrated or to a separately provided VBB line. The source of the MP1 is connected to the FX1, its drain to the WL1, and its gate to the MWLB. The substrate (either the back gate or the well potential) of the MP1 is connected to the VPP (e.g. 3.5 V) Incidentally, the WLs of the memory array arranged over the SWDA-U and those of the memory array underneath it are connected to each other by the SWDA-U.

Hereupon, the operation that takes place when the MWLB and the FX1 are activated and the WL1 is selected. In this case, the MWLB is at 0 V, the FX1 at 3.5 V, the FX2, FX5 and FX6 at 0 V, the FX1B at 0 V, and the FX2B, FX5B and FX6B at 3.5 V. At the SWD1, the MP1 is turned on, the MN1 and MN2 are turned off to activate the WL1 to 3.5 V. On the other hand, at the SWD2, SWD5 and SWD6, the transistor corresponding to the MN1 is turned off, that corresponding to the MN2 is turned on, and the WL2, WL5 and WL6 are connected to the VSSU (0 V). While the gate of the transistor corresponding to the MP1 is at 0 V, as its source is also at 0 V, the transistor is not turned on. Therefore, the WL2, WL5 and WL6 which are unselected WLs are connected to the VSSU only by the MN2.

Other operating modes of the WL1 include (1) neither the MWLB nor the FX1 is selected and (2) the MWLB is unselected and the FX1 is selected. In (1) both the MN1 and MN2 are turned on and connected to the VSSU and in (2), only the MN1 is turned on and connected to the VSSU. The same applies to other SWDs as well.

Figure 4:
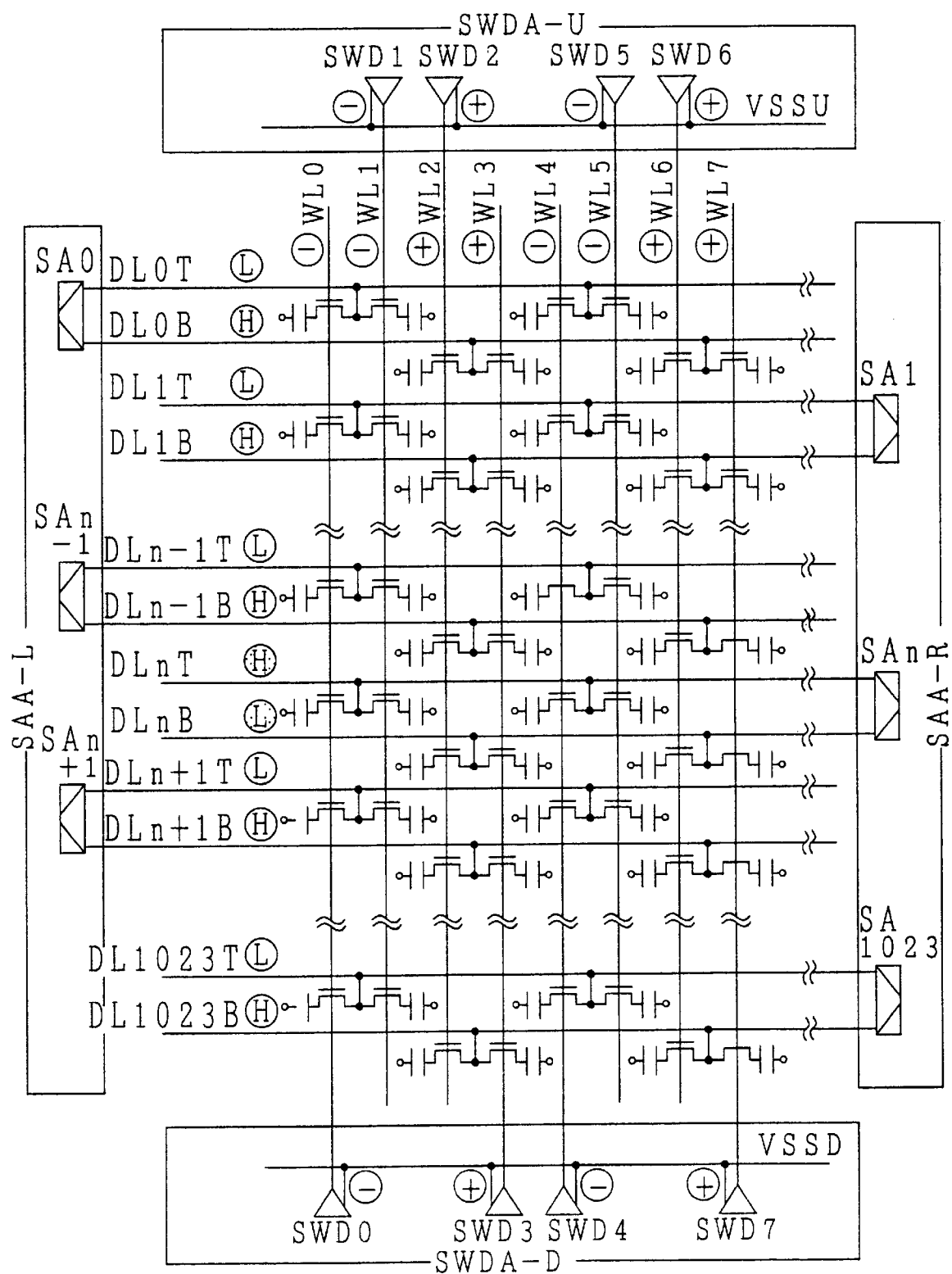
FIG. 4 is a diagram illustrating the principle of noise reduction by the first word line noise decreased memory array according to the invention.

Now will be described, with regard to the word line noise decreased memory array according to the invention, the WL noise reducing effect in the worst pattern wherein WL noise reaches its peak. What is considered here is a case in which, as shown in FIG. 4, low level (L) signals emerge on all the 1024 pairs of or 2048 units of T side DLs from the DL0T through DL1023T, except the DLnT, and a high level (H) signal emerges only on the DLnT. This pattern, or the reversed pattern in terms of H and L, is the condition under which WL noise reaches its peak. Activation of SAs results in amplification of all the T side DLs from DL0T through DL1023T except the DLnT to 0 V, and amplification of all the B side DLs from DL0B through DL1023B except the DL0B to 1.8 V. Circled Ls over the DL0T and DL1T denote the amplification of the DL0T and DL1T to 0 V and the circled Hs above the DL0B and DL1B, the amplification of the DL0B and DL1B to 1.8 V. The noise arising on the WL0 then will be as described below. The WL0 receives negative noise from all the T side data lines from the DL0T through DL1023Tl except the DLnT via coupling capacitances. On the other hand, the WL0 receives positive noise from all the B side data lines from the DL0B through DL1023B except the DLnB via coupling capacitances. Whereas the noise arising on the WL0 will be the sum of these noise components, since the WL0 is connected to the MC which in turn is connected to the T side DLs from DL0T through DL1023T as stated above, the WL0-DL0B coupling capacitance, for instance, is only about 1% of the WL0-DL0T coupling capacitance. Thus, the coupling capacitance between the WL0 and data lines on the B side is negligibly smaller than the coupling capacitance between the WL0 and data lines on the T side. Therefore, the negative noise arises almost uncanceled on the WL0. This is indicated by the circled minus signs above the WL0. Similarly, negative noise arises on the WL1, WL4 and WL5. Conversely, as the WL2, WL3, WL6 and WL7 are connected to the MC which in turn is connected to the B side DLs from DL0B through DL1023B, the WL2-DL0T coupling capacitance, for instance, is smaller than, only about 1% of, the WL2-DL0B coupling capacitance. Thus, the coupling capacitance between the WL2 and data lines-on the T side is negligibly smaller than the coupling capacitance between the WL2 and data lines on the B side. Therefore, positive noise arises on these WLs, which is indicated by the circled plus signs above the WLs.

Figure 13:
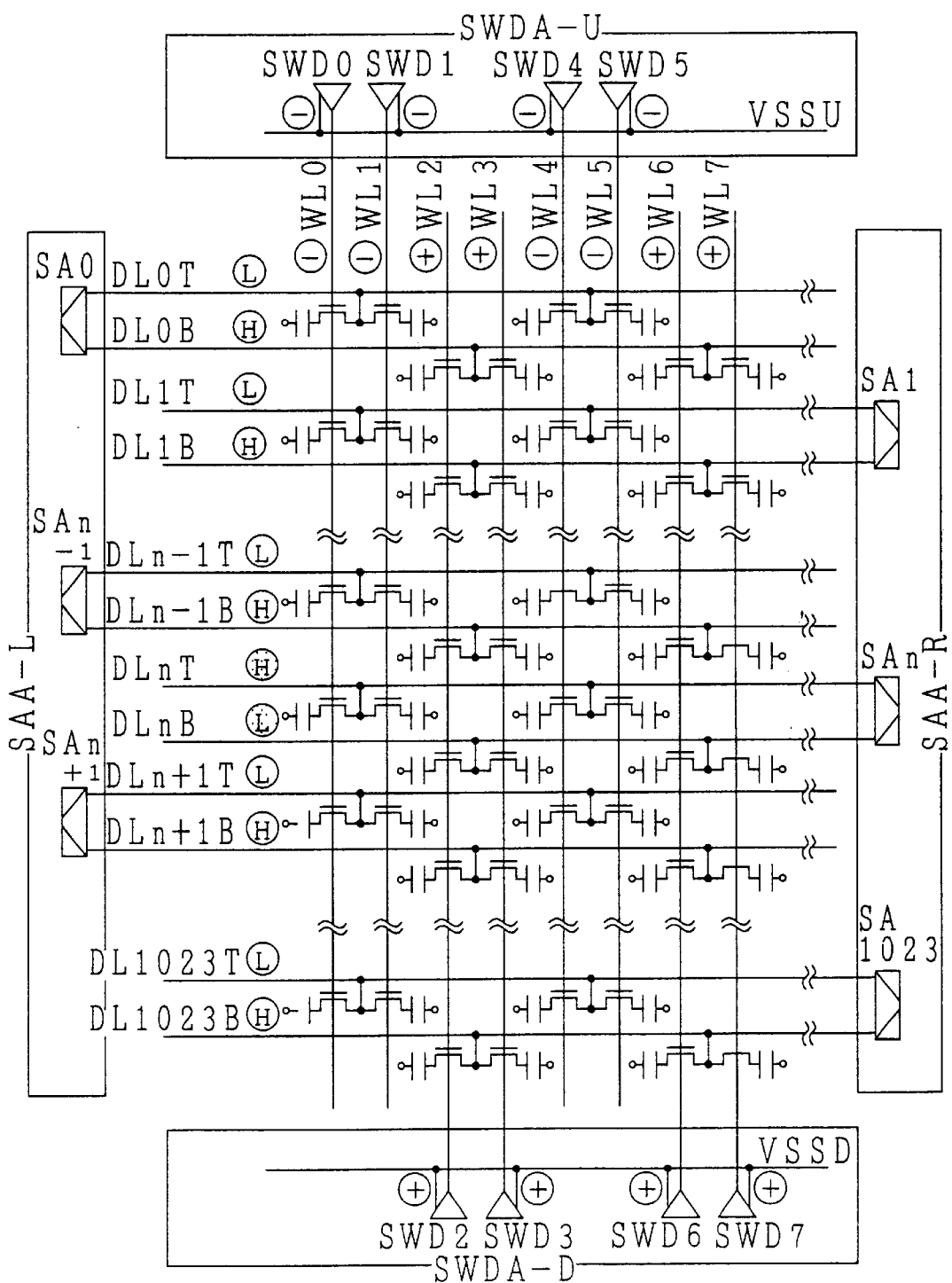
FIG. 13 is a diagram illustrating the principle of word line noise by the memory array of FIG. 10.
Figure 14A:
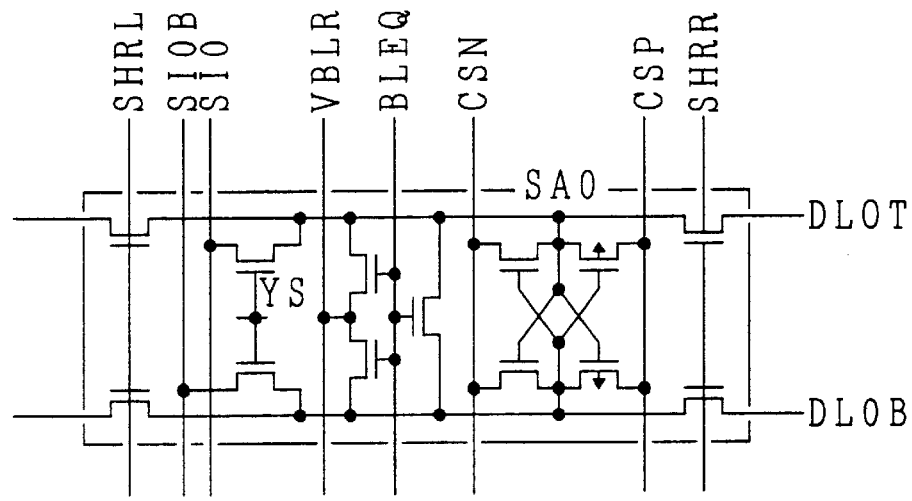
FIGS. 14A–14B respectively illustrate a circuit diagram and operating wave forms of the sense amplifiers in the memory array of FIGS. 10A–10B.
Figure 14B:
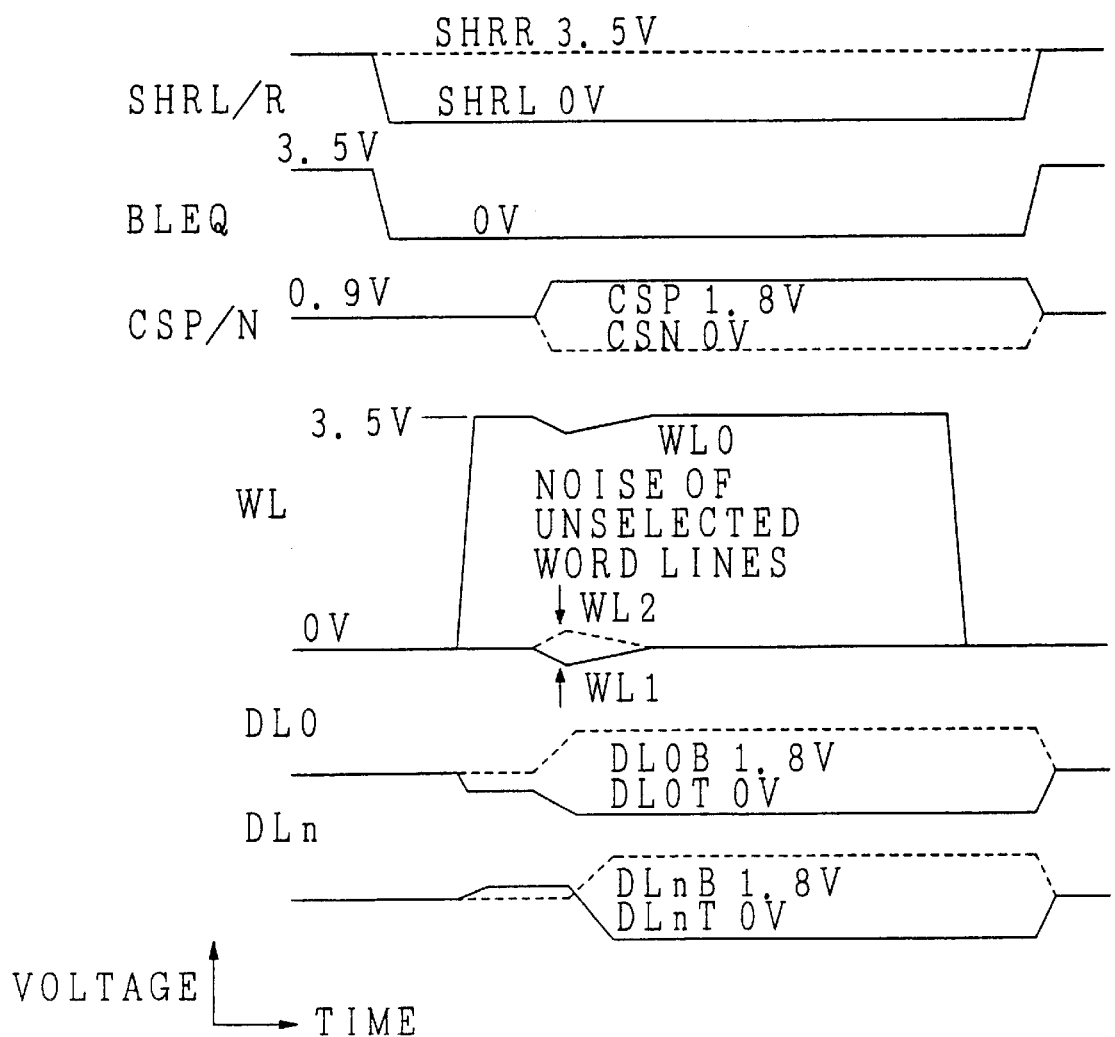

As illustrated in FIG. 4, in the word line noise decreased memory array according to the invention, unlike in the memory shown FIG. 13 studied before this application for patent, negative noise arises on one half of the WLs connected to the SWDA-U, and positive noise arises the other half. Therefore, as the positive and negative noise components cancel each other on the VSSU, which is a voltage source line on the SWDA-U, the WL noise is reduced. At the same time, in the SWDA-D as well, negative noise arises on one half of the WLs connected to it, and positive noise arises the other half. Therefore, as the positive and negative noise components cancel each other on the VSSD, which is a voltage source line on the SWDA-D, the WL noise is reduced.

Thus, in the word line noise decreased memory array according to the invention, signals of whatever pattern may emerge on data lines, positive and negative WL noise components work to cancel each other in the SWDs when the data lines are subjected to amplification, so that the WL noise can be reduced. Therefore, signals read out by sense amplifiers can be prevented from deterioration thereby to increase the reliability of memory operation.

Figure 10A:
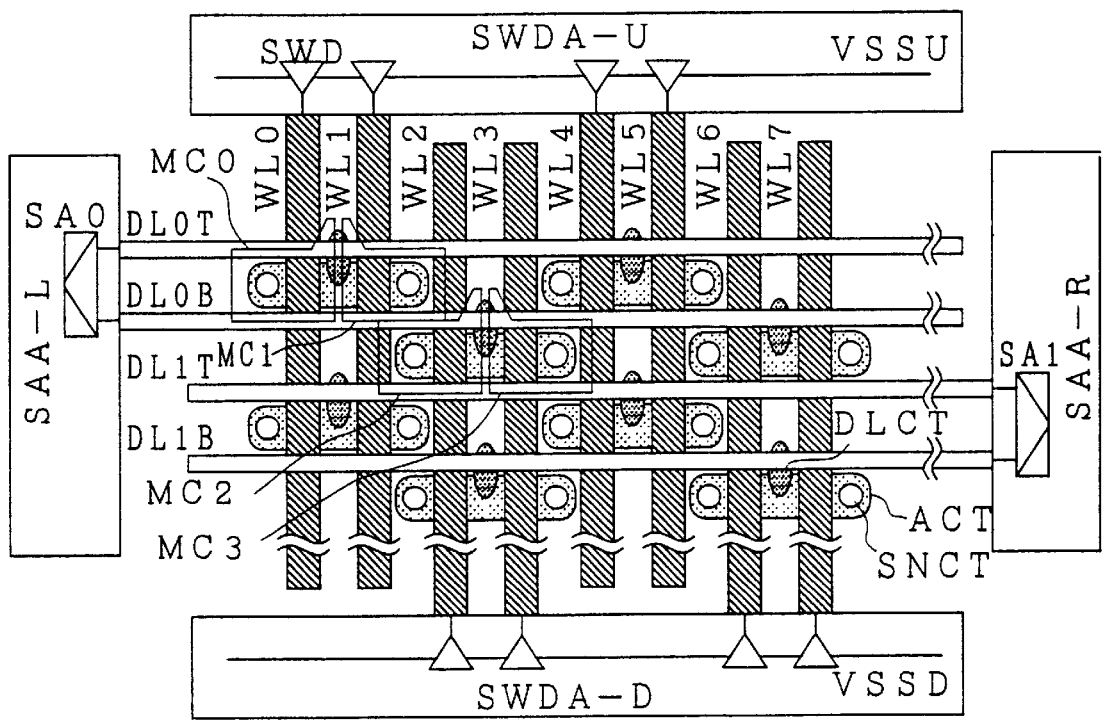
FIGS. 10A–10B respectively illustrate a layout and a circuit diagram of a DRAM memory array studied before this application for patent.
Figure 10B:
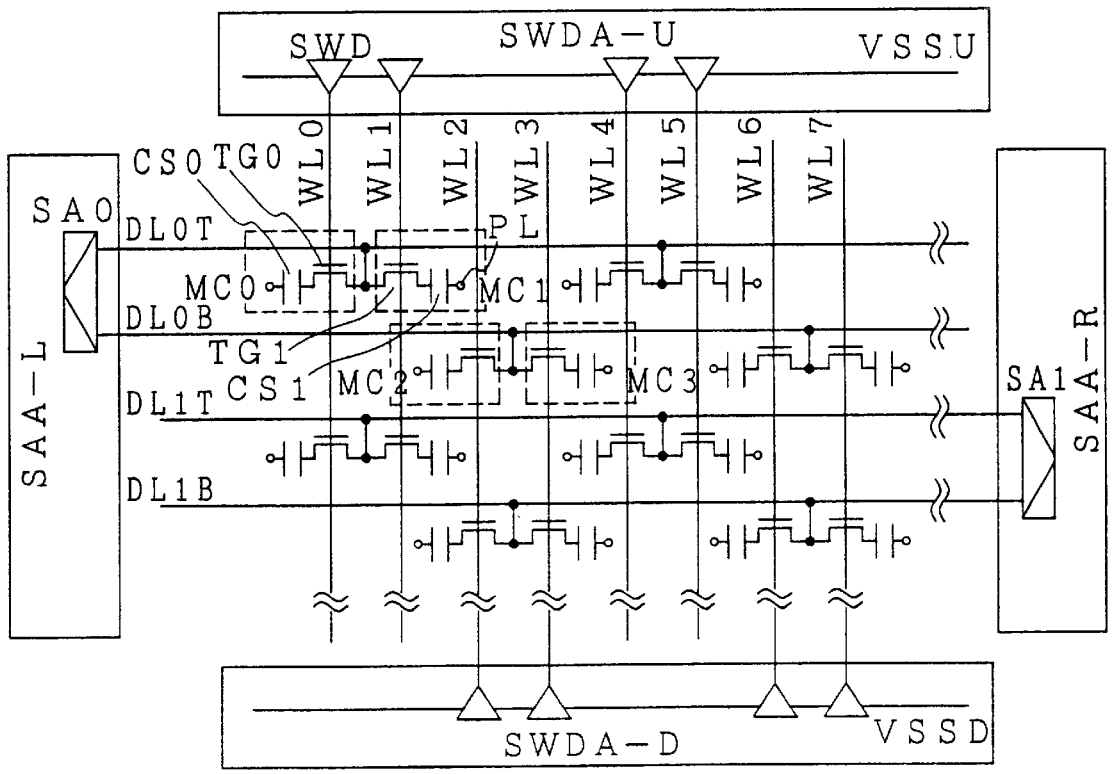

To note the quantity of signals emerging from memory cells, since smaller signals can be accurately sensed than by the memory array of FIG. 10, a greater margin of operation can be allowed against insufficient capacitor capacitances of memory cells or a drop in electric charges stored in the memory cell capacitors due to a leak current.

Furthermore, this array is more tolerant to an imbalance between the coupling capacitance between one of two data lines operating as a pair and one word line and that between the other data line and the same word line. Accordingly, it is possible to shape the storage node contact of each memory cell ovally as shown in FIG. 1, and the process to linearly lay out the diffused layer is facilitated.

Thus by using the array according to the present invention, the refresh performance of the DRAM can be improved. The manufacturing process of the DRAM can be facilitated, too.

(Embodiment 2)

Figure 5A:
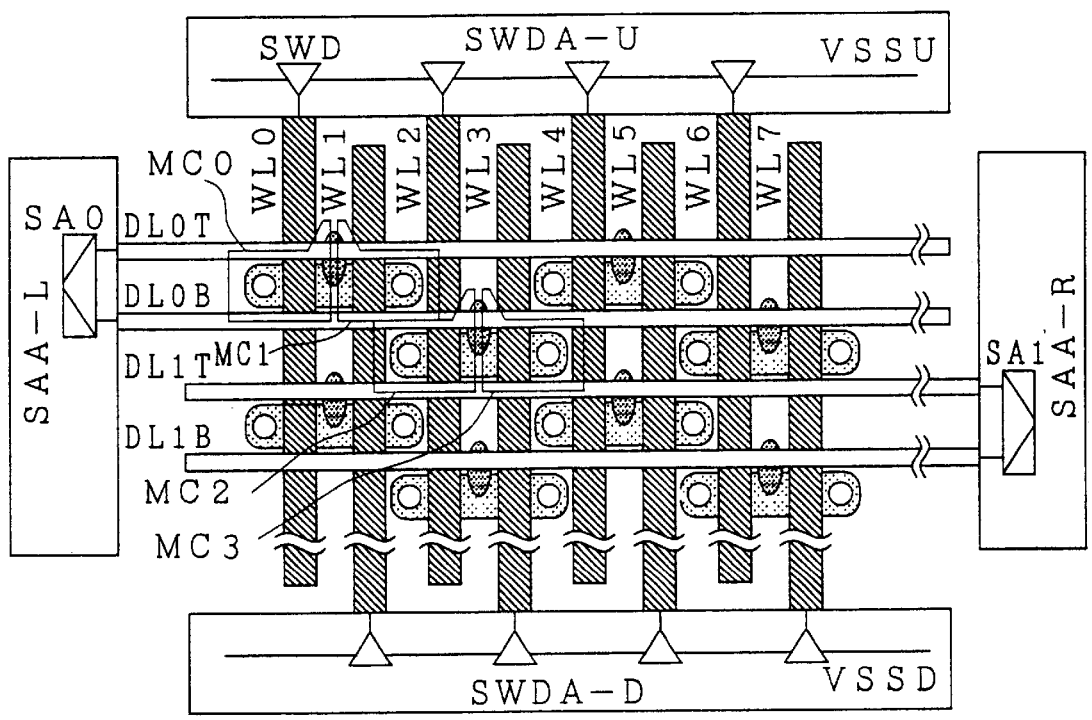
FIGS. 5A–5B respectively illustrate a layout and a circuit diagram of a second word line noise decreased memory array according to the invention.
Figure 5B:
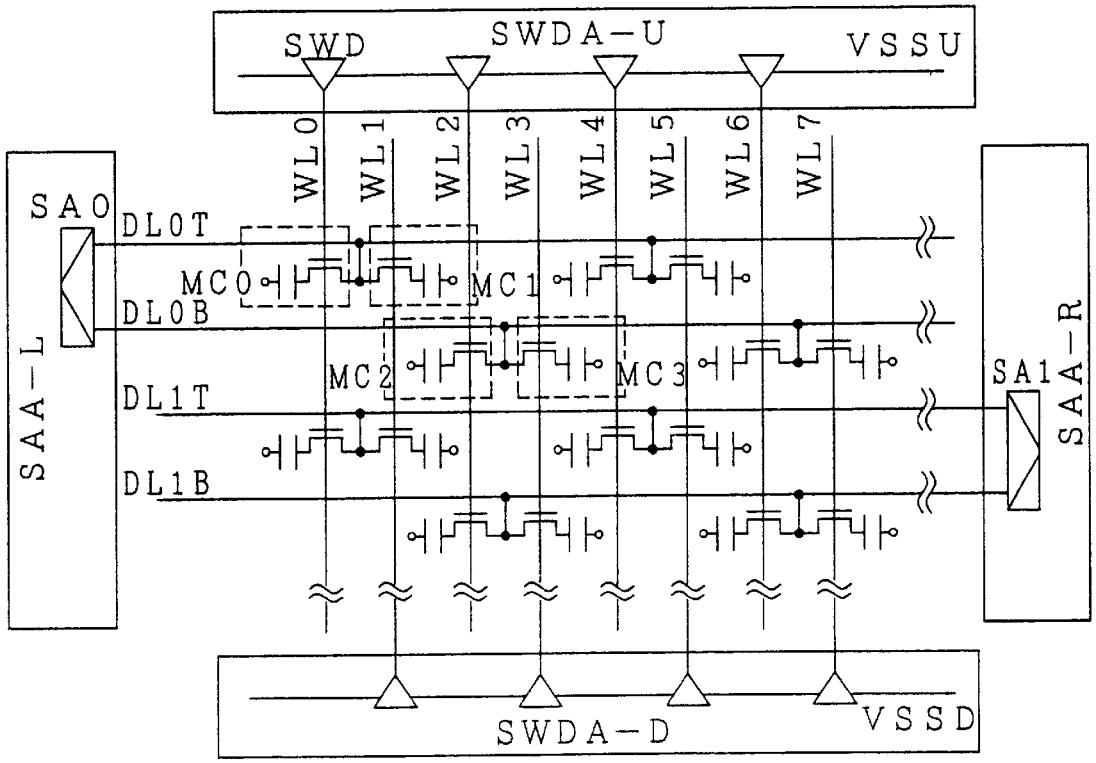

A layout and a circuit diagram of a second word line noise decreased memory array according to the invention are shown in FIG. 5. This embodiment differs from Embodiment 1 in that, on the boundaries between SWD arrays and the memory array, WLs ending at a boundary and WLs connected to an SWD array alternate each other at one line intervals.

Regarding this embodiment, too, the relationship of connection between WLs and the SWD arrays will be noted. To look at the MC0 and MC1, two mutually adjoining memory cells connected to the DL0T, they share the same DLCT, but while the WL0, out of the WLs connected to these cells, is connected to the SWDA-U, the WL1 is connected to the SWDA-D. On the other hand, to look at the MC2 and MC3, two mutually adjoining memory cells connected to the DL0B, they also share the same DLCT, but while the WL2, out of the WLs connected to these cells, is connected to the SWDA-U, the WL3 is connected to the SWDA-D. Therefore, in the layout of the word line noise decreased memory array of Embodiment 2 as well, WLs connected to two memory cells sharing the same DLCT are connected to different SWD arrays.

In this embodiment as well, in an overall view of the memory array, as the pattern illustrated in FIG. 5(a) is reiterated vertically and horizontally, half of the WLs connected to the MCs connected to the DL0T (WL0 and WL4 in the diagram) are connected to the SWDA-U, and the other half (WL1 and WL5 in the diagram) are connected to the SWDA-D. Also, half of the WLs connected to the MCs connected to the DL0B (WL2 and WL6 in the diagram) are connected to the SWDA-U, and the other half (WL3 and WL7 in the diagram) are connected to the SWDA-D. Therefore, out of all the word lines connected to memory cells connected to any one data line, half are connected to one of the two subword driver arrays, and the other half are connected to the other subword driver array. Furthermore, SWDs in the SWDA-U are connected to VSSU, a common VSS line. Similarly, SWDs in the SWDA-D are connected to VSSD, another common VSS line. Wiring of the VSSs in this manner makes it possible to cancel WL noise on the VSSs.

In the second word line noise decreased memory array according to the invention, too, it is possible to cause positive and negative WL noise components to cancel each other in the SWD when the data lines are subjected to amplification, so that the WL noise can be reduced. Therefore, signals read out by sense amplifiers can be prevented from deterioration thereby to increase the reliability of memory operation.

(Embodiment 3)

Figure 6A:
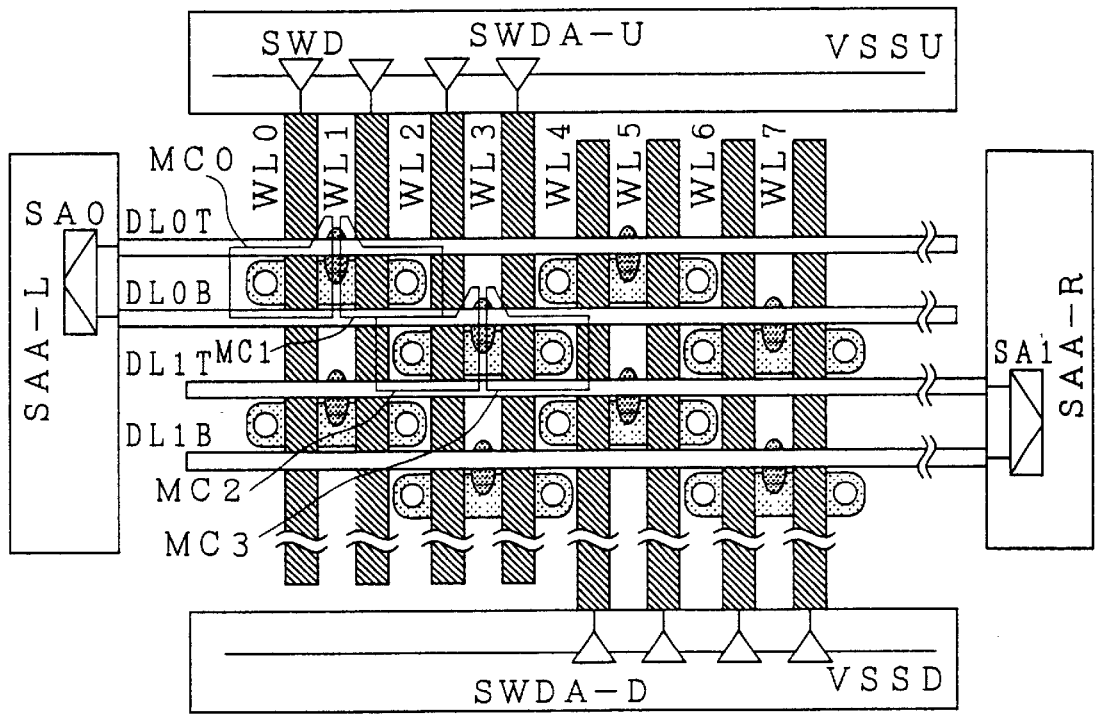
FIGS. 6A–6B respectively illustrate a layout and a circuit diagram of a third word line noise decreased memory array according to the invention.
Figure 6B:
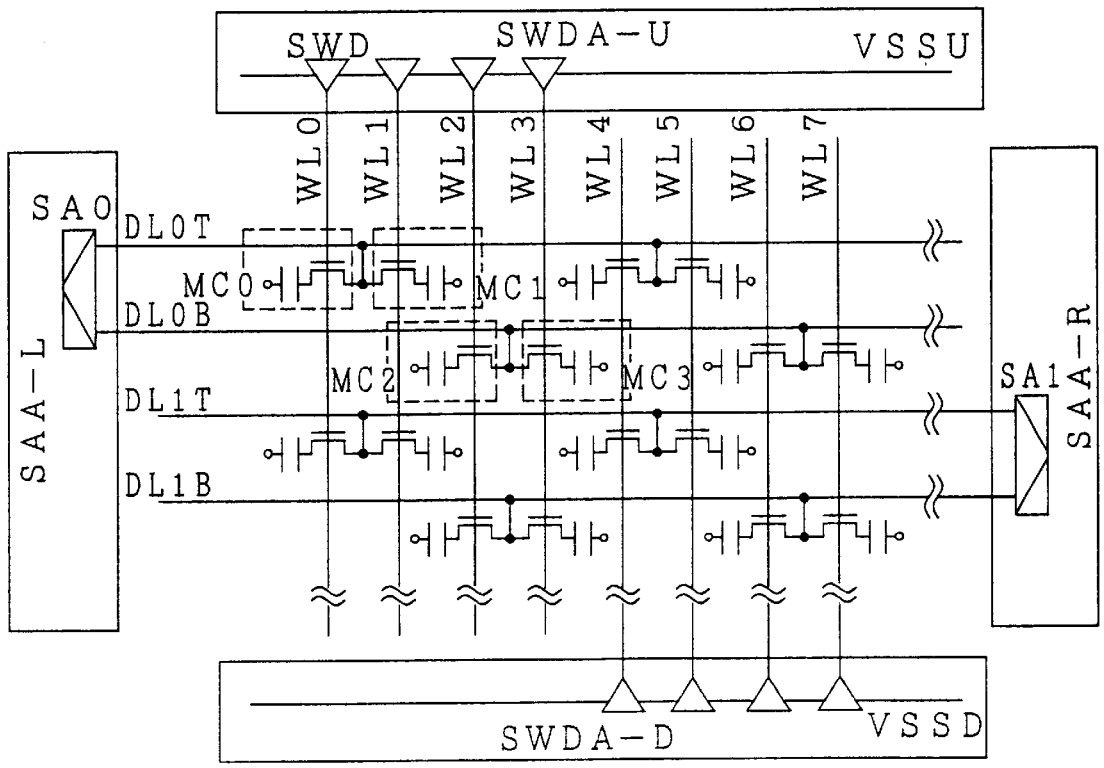

FIG. 6 illustrates a layout and a circuit diagram of a third word line noise decreased memory array according to the present invention. This embodiment differs from Embodiments 1 and 2 in that in that, on the boundaries between SWD arrays and the memory array, WLs connected to an SWD array and WLs ending at a boundary alternate each other at four line intervals.

Regarding this embodiment, too, the relationship of connection between WLs and the SWD arrays will be noted. Both the WL0 and WL1 connected to the MC0 and MC1, two mutually adjoining memory cells connected to the DL0T, are connected to the SWDA-U. On the other hand, both the WL2 and WL3 connected to the MC2 and MC3, two mutually adjoining memory cells connected to the DL0B, are also connected to the SWDA-U. Therefore, in this embodiment, noise components arising on the WL0 and WL1 are canceled on the VSSU by those arising on the WL2 and WL3. Similarly, noise components arising on the WL4 and WL5 are canceled on the VSSD by those arising on the WL6 and WL7.

In this embodiment as well, in an overall view of the memory array, as the pattern illustrated in FIG. 6(a) is reiterated vertically and horizontally, half of the WLs connected to the MCs connected to the DL0T (WL0 and WL1 in the diagram) are connected to the SWDA-U, and the other half (WL4 and WL5 in the diagram) are connected to the SWDA-D. Also, half of the WLs connected to the MCs connected to the DL0B (WL2 and WL3 in the diagram) are connected to the SWDA-U, and the other half (WL6 and WL7 in the diagram) are connected to the SWDA-D. Therefore, out of all the word lines connected to memory cells connected to any one data line, half are connected to one of the two subword driver arrays, and the other half are connected to the other subword driver array.

In the third word line noise decreased memory array according to the invention, too, it is possible to cause positive and negative WL noise components to cancel each other in the SWD when the data lines are subjected to amplification, so that the WL noise can be reduced. Therefore, signals read out by sense amplifiers can be prevented from deterioration thereby to increase the reliability of memory operation.

(Embodiment 4)

Figure 7A:
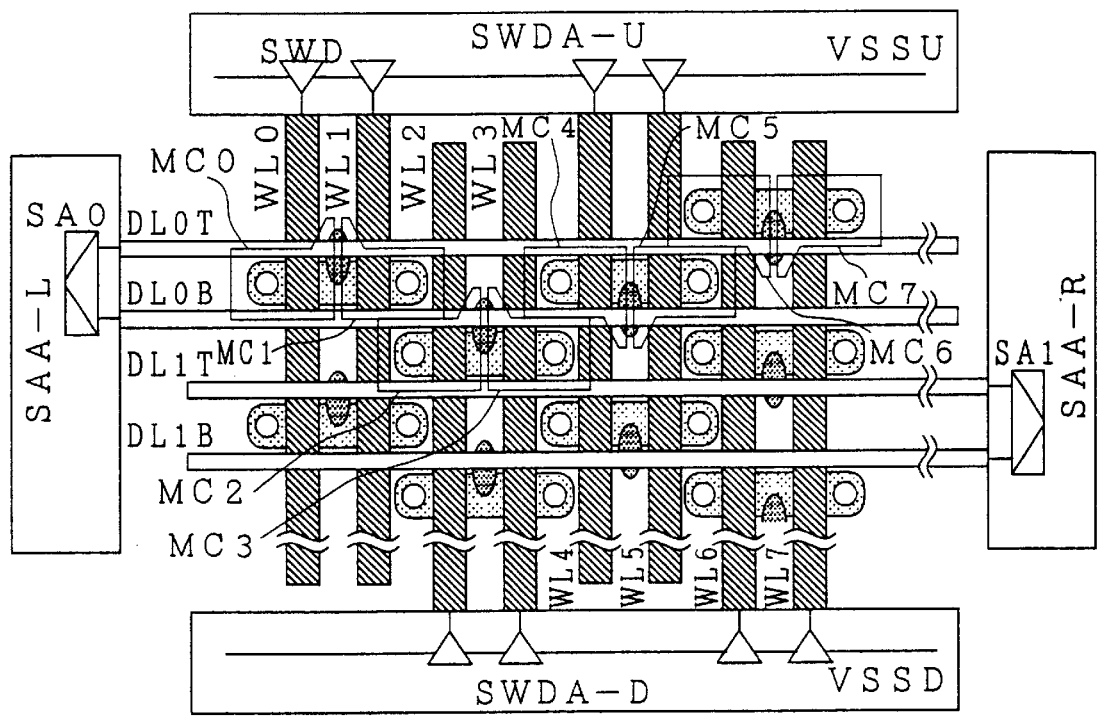
FIGS. 7A–7B respectively illustrate a layout and a circuit diagram of a fourth word line noise decreased memory array according to the invention.
Figure 7B:
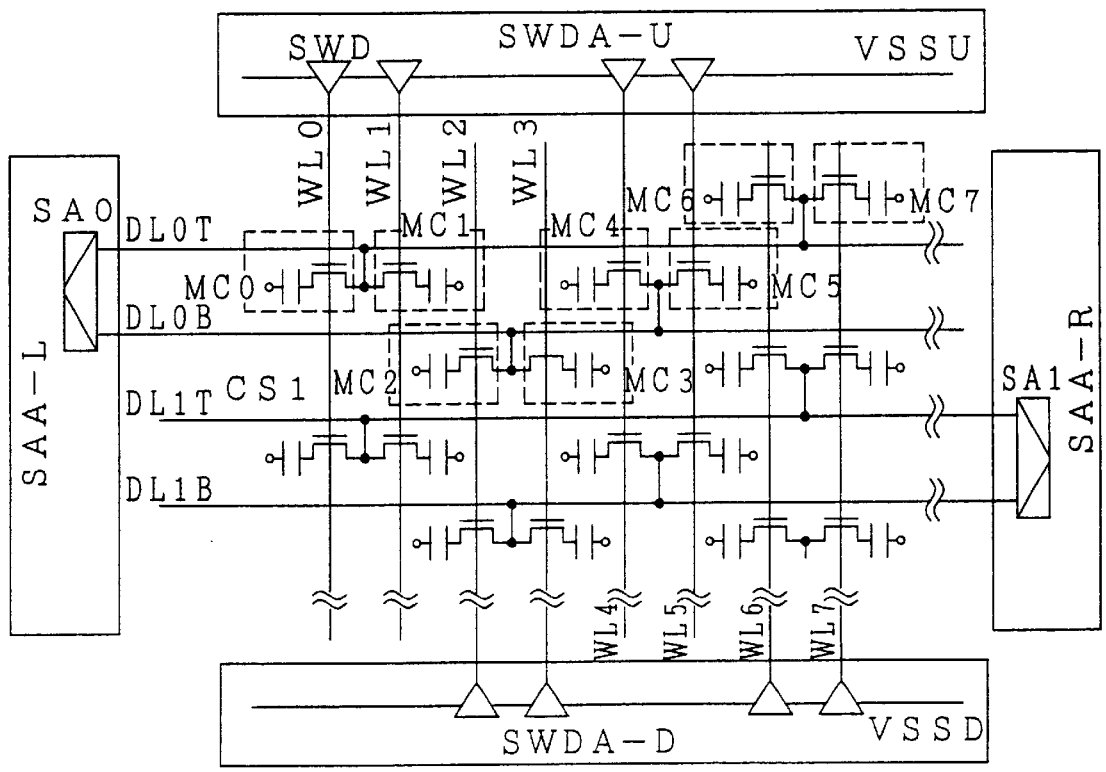
Figure 11A:
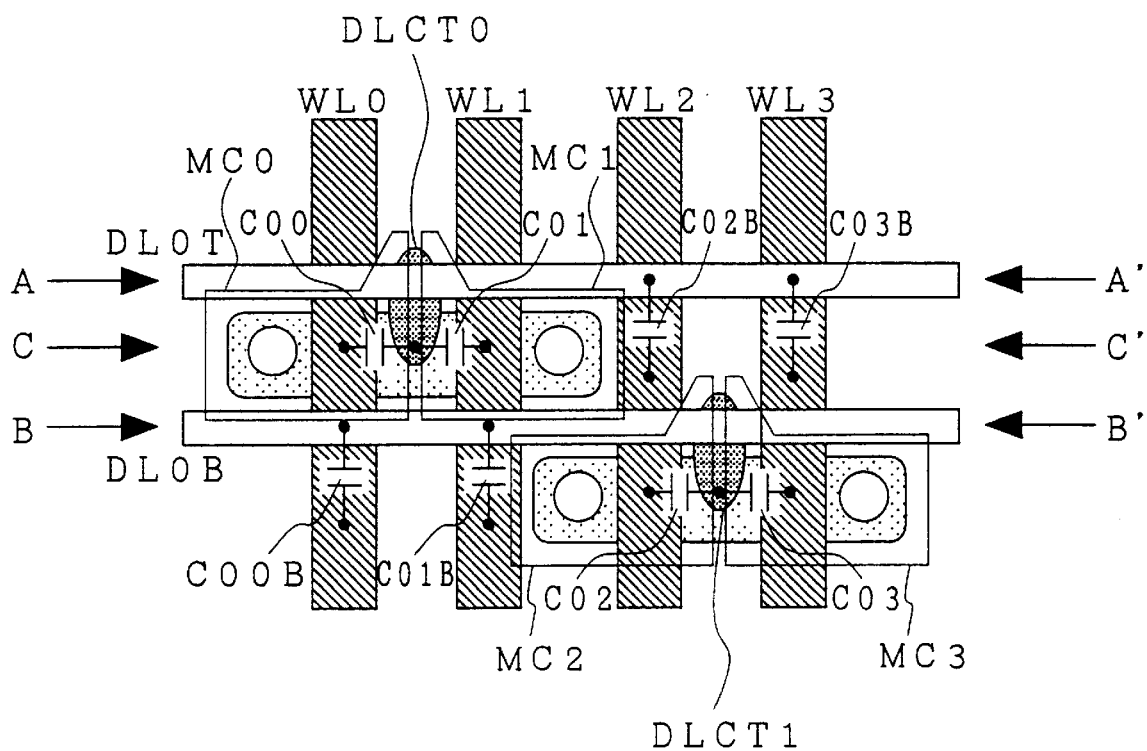
FIGS. 11A–11B illustrate respective enlarged versions of the layout and the circuit diagram of the memory cell of FIGS. 10A–10B.
Figure 11B:
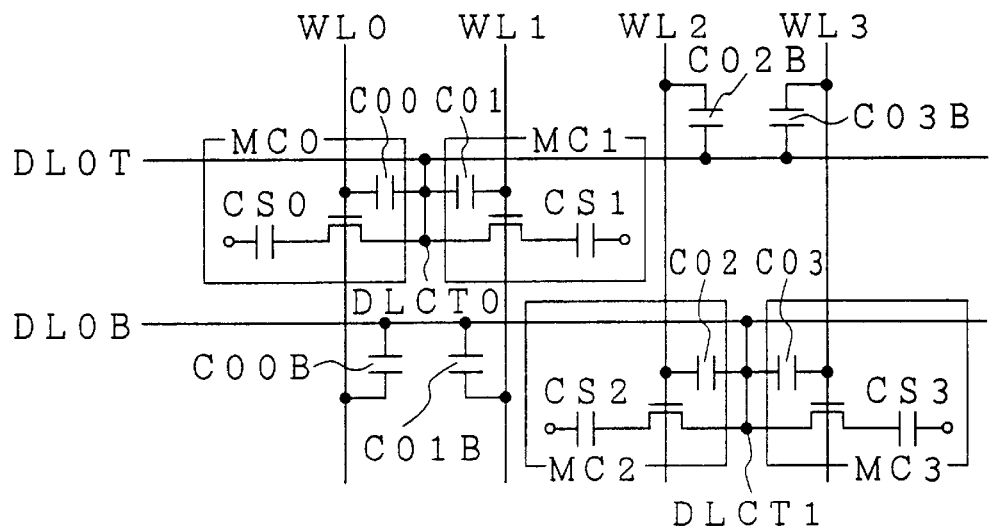
Figure 12C:
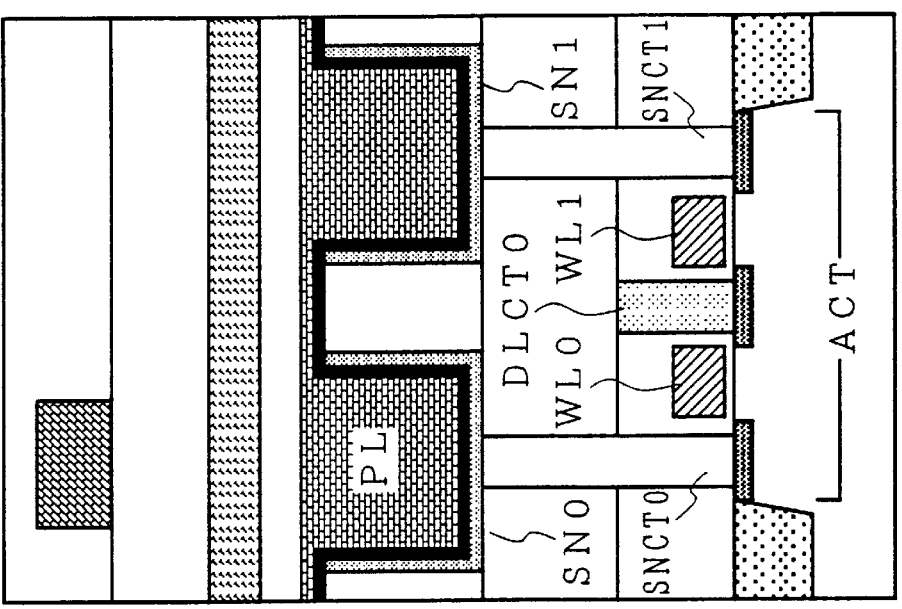
FIGS. 12A–12C illustrate respective cross sections of essential parts of a memory in the memory array of FIGS. 11A–11B.
Figure 12B:
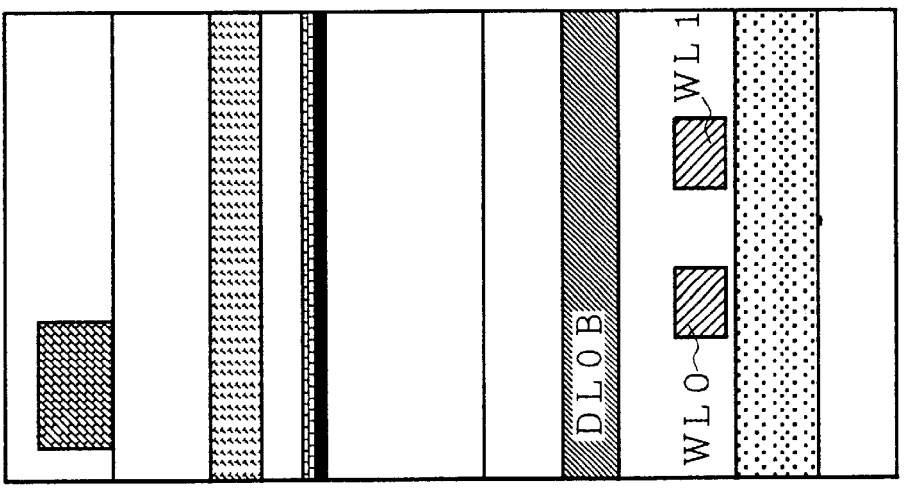
Figure 12A:
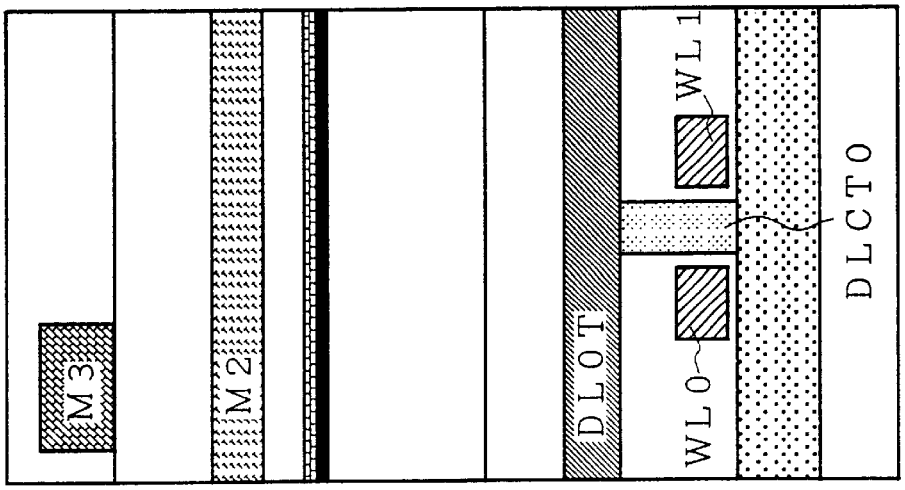

FIG. 7 illustrates a layout and a circuit diagram of a fourth word line noise decreased memory array according to the invention. This embodiment, though its boundaries between the SWD arrays and the memory array are similar to those shown in FIG. 11, differs from Embodiments 1, 2 and 3 in that the directions of the data line contacts DLCTs of the MC4, MC5, MC6 and MC7 in the memory cell array are altered so that memory cells whose diffused layers are aligned in the DL direction are connected alternately to different DLs.

Both the WL0 and WL1 connected to the MC0 and MC1, two mutually adjoining memory cells connected to the DL0T, are connected to the SWDA-U. On the other hand, both the WL2 and WL3 connected to the MC2 and MC3, two mutually adjoining memory cells connected to the DL0B, are also connected to the SWDA-U. Therefore, in this embodiment, noise components arising on the WL0 and WL1 are canceled on the VSSU by those arising on the WL2 and WL3. The two mutually adjoining memory cells MC4 and MC5 are also connected to the DL0B, with an oval DLCT being disposed toward underneath the diffused layer, and the WL4 and WL5 connected to them are connected to the SWDA-U. Similarly, the two mutually adjoining memory cells MC6 and MC7 are connected to the DL0T, with an oval DLCT being disposed toward underneath the diffused layer, and the WL6 and WL7 connected to them are connected to the SWDA-U.

Therefore, in this embodiment, noise components arising on the WL0 and WL1 are canceled on the VSSU by those arising on the WL4 and WL5. Similarly, noise components arising on the WL2 and WL3 are canceled on the VSSD by those arising on the WL6 and WL7.

In this embodiment as well, in an overall view of the memory array, as the pattern illustrated in FIG. 7(a) is reiterated vertically and horizontally, half of the WLs connected to the MCs connected to the DL0T (WL0 and WL1 in the diagram) are connected to the SWDA-U, and the other half (WL6 and WLu7 in the diagram) are connected to the SWDA-D. Also, half of the WLs connected to the MCs connected to the DL0B (WL4 and WL5 in the diagram) are connected to the SWDA-U, and the other half (WL2 and WL3 in the diagram) are connected to the SWDA-D. Therefore, out of all the word lines connected to memory cells connected to any one data line, half are connected to one of the two subword driver arrays, and the other half are connected to the other subword driver array.

In the fourth word line noise decreased memory array according to the invention, too, it is possible to cause positive and negative WL noise components to cancel each other in the SWD when the data lines are subjected to amplification, so that the WL noise can be reduced. Therefore, signals read out by sense amplifiers can be prevented from deterioration thereby to increase the reliability of memory operation.

(Embodiment 5)

This embodiment is a second subword driver (SWD) for use in the word line noise decreased memory array according to the present invention. Although it is shown here in combination with the first word line noise decreased memory array according to the invention, it is also applicable to other word line noise decreased memory arrays.

Figure 8:
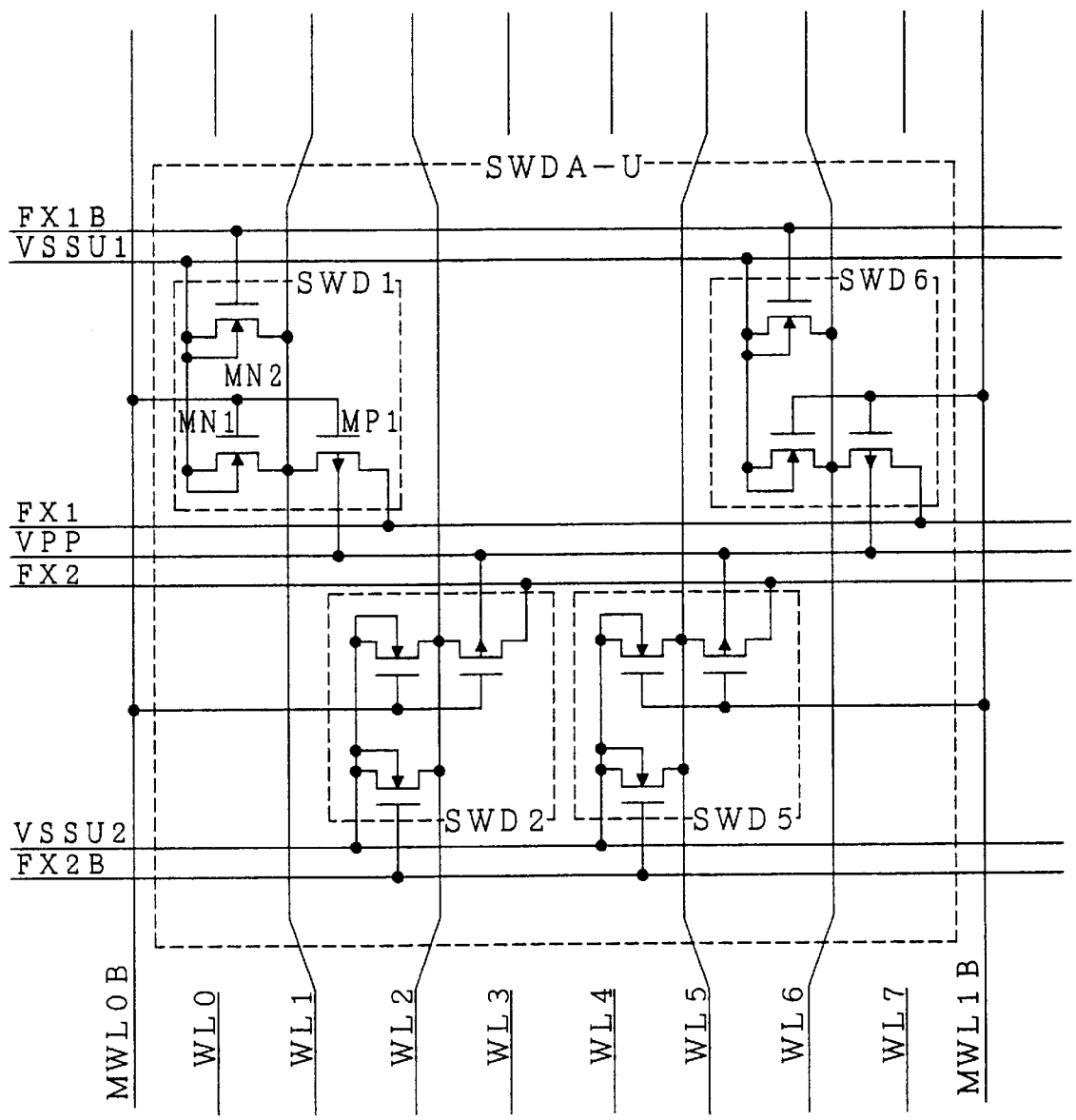
FIG. 8 is a circuit diagram of a second subword driver for use in a word line noise decreased memory array according to the invention.

In the SWD illustrated in FIG. 8, the MWLB of FIG. 3 is divided into an MWLB0 and an MWLB1, and the number of FXs is halved to match this division. This arrangement may enable the layout area of the SWDs to be halved. The SWDs are arranged in two tiers, and the VSS is divided into two, a VSSU1 and a VSSU2.

Where such SWDs are used, in order to eliminate WL noise, it is necessary to connect to each VSSU an SWD matching both the WLs to be connected to MCs to be connected to the DL0T and the WLs to be connected to MCs to be connected to the DL0B. Thus, in the configuration illustrated in FIG. 8, as that in FIG. 1, the WL1 and WL5 are connected to MCs to be connected to the DL0T. Further, the WL2 and WL6 are connected to MCs to be connected to the DL0B. In such a case, by connecting the SDW1 to which the WL1 is connected and the SWD6 to which the WL6 is connected to the VSSU1, WL noise components on these WLs can be eliminated on the VSSU1. Further, by connecting the SDW2 to which the WL2 is connected and the SWD5 to which the WL5 is connected to the VSSU2, WL noise components on these WLs can be eliminated on the VSSU2.

Therefore, by the combined use of the subword driver and a word line noise decreased memory array both according to the present invention, it is possible to cause positive and negative WL noise components to cancel each other in the SWD when the data lines are subjected to amplification, so that the WL noise can be reduced. Accordingly, signals read out by sense amplifiers can be prevented from deterioration thereby to increase the reliability of memory operation.

(Embodiment 6)

This embodiment is a third subword driver (SWD) for use in the word line noise decreased memory array according to the present invention. Although it is shown here in combination with the first word line noise decreased memory array according to the invention, it is also applicable to other word line noise decreased memory arrays.

Figure 9:
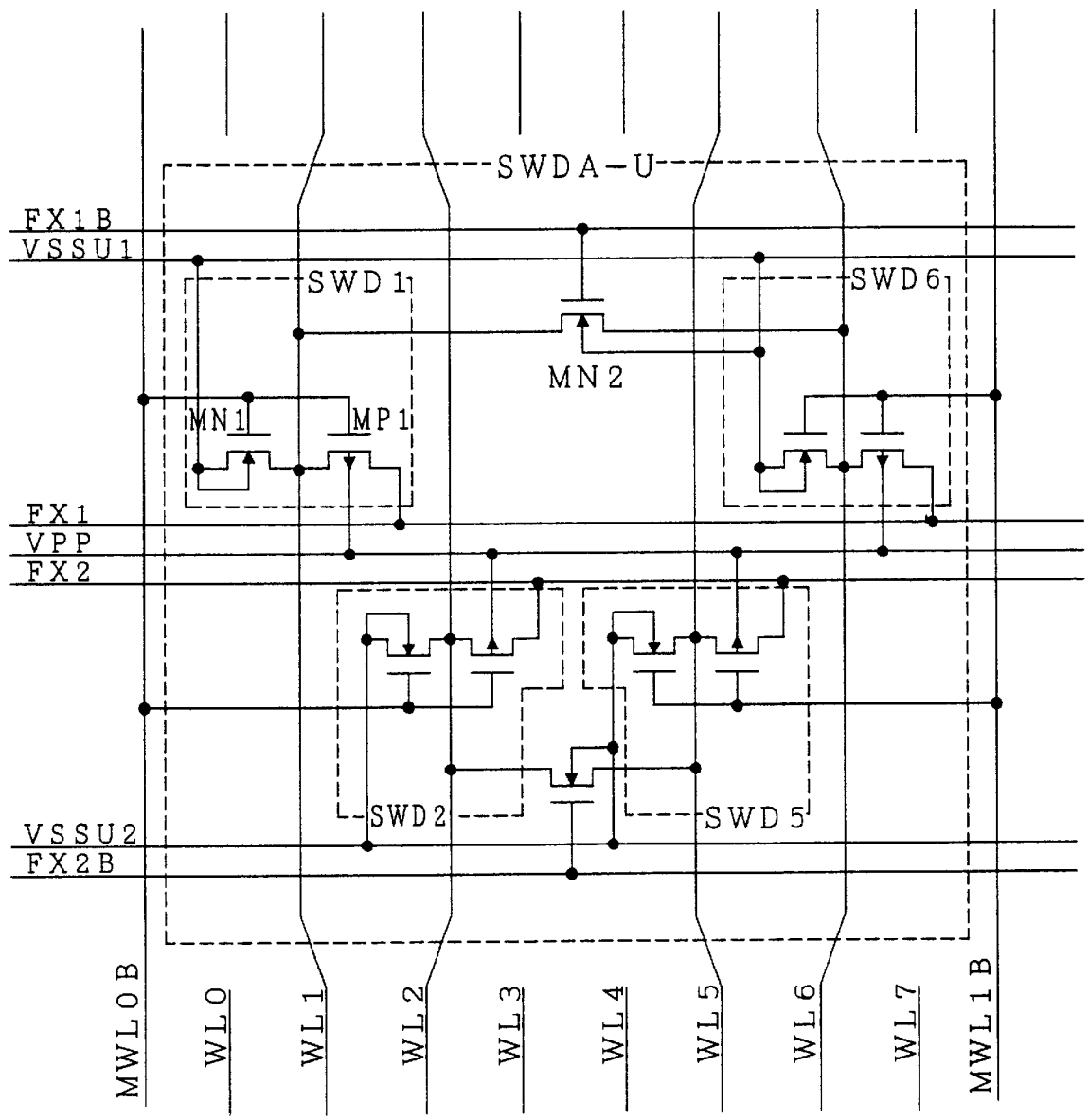
FIG. 9 is a circuit diagram of a third subword driver for use in a word line noise decreased memory array according to the invention.

In the SWD illustrated in FIG. 9, a transistor corresponding to the MN2 of the SWD1 in FIG. 8 is shared by the SWD1 and SWD6 and their WLs are connected to each other. This arrangement enables the number of transistors to be used by the SWDs to be reduced, and accordingly the layout area of the SWDs can be reduced. The SWDs are arranged in two tiers, and the VSS is divided into two, a VSSU1 and a VSSU2, as in the arrangement of FIG. 8.

Where such SWDs are used, in order to eliminate WL noise, it is necessary to connect to each VSSU an SWD matching both the WLs to be connected to MCs to be connected to the DL0T and the WLs to be connected to MCs to be connected to the DL0B. Thus, in the configuration illustrated in FIG. 9, as that in FIG. 1, the WL1 and WL5 are connected to MCs to be connected to the DL0T. Further, the WL2 and WL6 are connected to MCs to be connected to the DL0B. In such a case, by connecting the SWD1 to which the WL1 is connected and the SWD6 to which the WL6 is connected to the VSSU1, WL noise components on these WLs can be eliminated on the VSSU1. Further, by connecting the SWD2 to which the WL2 is connected and the SWD5 to which the WL5 is connected to the VSSU2, WL noise components on these WLs can be eliminated on the VSSU2.

Therefore, by the combined use of the subword driver and a word line noise decreased memory array both according to the present invention, it is possible to cause positive and negative WL noise components to cancel each other in the SWD when the data lines are subjected to amplification, so that the WL noise can be reduced. Accordingly, signals read out by sense amplifiers can be prevented from deterioration thereby to increase the reliability of memory operation.

In a word line noise decreased memory array DRAM according to the invention, signals of whatever pattern may emerge on data lines, positive and negative WL noise components work to cancel each other in the SWDs when the data lines are subjected to amplification, so that the WL noise can be reduced. Therefore, signals read out by sense amplifiers can be prevented from deterioration thereby to increase the reliability of memory operation.

Further to note the quantity of signals emerging from memory cells, since smaller signals can be accurately sensed than by a memory array in which DL-WL coupling capacitances are unbalanced, a greater margin of operation can be allowed against insufficient capacitor capacitances of memory cells or a drop in electric charges stored in the memory cell capacitors due to a leak current. Therefore, by using the array according to the present invention, the refresh performance of the DRAM can be improved. The manufacturing process of the DRAM can be facilitated, too.

What is claimed is:

1. A semiconductor integrated circuit comprising:

a first data line and a second data line disposed adjacent to each other;

a plurality of word lines crossing said first and second data lines;

a plurality of memory cells;

first, second, third, and fourth word driver groups coupled to said plurality of word lines;

first, second, third, and fourth voltage supply lines, each coupled to corresponding one of said first to fourth word driver groups to supply them a predetermined potential for unselected state; and a sense amplifier connected to said first and second data lines, wherein said plurality of memory cells are arranged at intersections between said plurality of word lines and one of said first and said second data lines, respectively, wherein in eight adjoining word lines out of said plurality of word lines, two of said eight word lines are connected to said first word driver group, two others of said eight word lines are connected to said second word driver group, two still others of said eight word lines are connected to said third word driver group, and the rest two of said eight word lines are connected to said fourth word driver group, and wherein said first and second data lines are disposed between said first and second word driver groups and said third and fourth word driver groups.

2. A semiconductor integrated circuit according to claim 1, wherein said first and second data lines, said plurality of word lines, and said plurality of memory cells are formed in a four sided area, wherein said first word driver group is disposed along a first side of said four sided area, wherein said second word driver group is disposed along said first word driver group, wherein said third word driver group is disposed along a second side opposite to said first side, and wherein said fourth word driver group is disposed along said third word driver group.

3. A semiconductor integrated circuit according to claim 1, wherein said eight word lines are denominated as first, second, third, fourth, fifth, sixth, seventh, and eighth word lines in the order of their adjoining others, wherein said plurality of memory cells are arranged at intersections of said first, second, fifth, and sixth word lines and said first data line and at intersections of said third, fourth, seventh, and eighth word lines and said second data line.

4. A semiconductor integrated circuit according to claim 3, wherein said first and eighth word lines are coupled to said first word driver group, wherein said second and seventh word lines are coupled to said third word driver group, wherein said third and sixth word lines are coupled to said fourth word driver group, and wherein said fourth and fifth word lines are coupled to said second word driver group.

5. A semiconductor integrated circuit according to claim 4, wherein said first and second data lines, said plurality of word lines, and said plurality of memory cells are formed in a four sided area, wherein said first word driver group is disposed along a first side of said four sided area, wherein said second word driver group is disposed along said first word driver group, wherein said third word driver group is disposed along a second side opposite to said first side, and wherein said fourth word driver group is disposed along said third word driver group.

6. A semiconductor integrated circuit according to claim 5, wherein each of said plurality of memory cells has a MOSFET and a capacitor for storing information, wherein a gate of each of said MOSFETs is connected to corresponding one of said plurality of word lines, and wherein in two memory cells provided at the intersections of said first data line and adjoining word lines of said plurality of word lines, a first diffused layer of each of the MOSFETs of said two memory cells is connected to said first data line via a shared first data line contact.

7. A semiconductor device comprising a memory array, said memory array including:

first, second, third, fourth, fifth, sixth, seventh, and eighth word lines arranged adjoining in that order;

first, second, third, fourth, fifth, sixth, seventh, and eighth word drivers each coupled to a corresponding one of said first to eighth word lines;

first and second data lines crossing said first to eighth word lines; and a first sense amplifier coupled to said first and second data lines, wherein said memory array has a four-sided area, said first to fourth word drivers are disposed along a first side of the four-sided area, said fifth to eighth word drivers are disposed along a second side of the four-sided area, and the first side is opposite to the second side.

8. A semiconductor device according to claim 7, wherein said first to fourth word line drivers are connected to a first potential supplying wire disposed along said first side, and said fifth to eighth word line drivers are connected to a second potential supplying wire disposed along said second side.

9. A semiconductor device according to claim 7, wherein said memory array further includes:

first and second memory cells provided at intersections between said first and second word lines and said first data line, respectively;

third and fourth memory cells provided at intersections between said third and fourth word lines and said second data line, respectively;

fifth and sixth memory cells provided at intersections between said fifth and sixth word lines and said first data line, respectively; and seventh and eighth memory cells provided at intersections between said seventh and eighth word lines and said second data line, respectively.

10. A semiconductor device according to claim 9, wherein each of said first to eighth memory cells includes a transistor and a capacitor connected to the transistor, for storing data.

11. A semiconductor device according to claim 9, wherein said first and second memory cells share a first data line contact for connection to said first data line, said third and fourth memory cells share a second data line contact for connection to said second data line, said fifth and sixth memory cells share a third data line contact for connection to said first data line, and said seventh and eighth memory cells share a fourth data line contact for connection to said second data line.

12. A semiconductor device according to claim 9, ninth and tenth memory cells provided at intersections between said first and second word lines and said third data line, respectively;

eleventh and twelfth memory cells provided at intersections between said third and fourth word lines and said fourth data line, respectively;

thirteenth and fourteenth memory cells provided at intersections between said fifth and sixth word lines and said third data line, respectively; and fifteenth and sixteenth memory cells provided at intersections between said seventh and eighth word lines and said fourth data line, respectively.

13. A semiconductor device according to claim 12, wherein each of said ninth to sixteenth memory cells includes a transistor and a capacitor connected to the transistor, for storing data.

14. A semiconductor device according to claim 12, wherein each of said first to sixteenth memory cells is a DRAM memory cell.

15. A semiconductor device according to claim 7, wherein said memory array further includes:

third and fourth data lines crossing said first to eighth word lines; and a second sense amplifier coupled to said third and fourth data lines.

16. A semiconductor device according to claim 15, wherein said first sense amplifier is disposed along a third side of the four-sided area, said second sense amplifier is disposed along a fourth side of the four-sided area, and the third side is opposite to the fourth side.

17. A semiconductor device according to claim 7, wherein the distance between said first and second word lines is smaller than 250 nm.

18. A semiconductor integrated circuit comprising:

a first data line and a second data line;

a sense amplifier connected to said first and second data lines;

first, second, third, and fourth word lines arranged adjoining in that order and crossing said first and second data lines;

first and second memory cells provided at intersections between said first and second word lines and said first data line, respectively;

third and fourth memory cells provided at intersections between said third and fourth word lines and said second data line, respectively, and first, second, third, and fourth word drivers, each coupled to a corresponding one of said first to fourth word lines, wherein said first and second data lines are disposed between said first and fourth word drivers and said second and third word drivers, wherein said first and second memory cells share a first data line contact for connection to said first data line, and wherein said third and fourth memory cells share a second data line contact for connection to said second data line.

19. A semiconductor device according to claim 18, further comprising:

third and fourth data lines crossing said first to fourth word lines; and a second sense amplifier coupled to said third and fourth data lines;

wherein the distance between said first and second data lines is smaller than 250 nm.

\* \* \* \* \*